United States Patent
Mohanty et al.

(10) Patent No.: US 10,649,119 B2
(45) Date of Patent: May 12, 2020

(54) DUTY CYCLE, DEPTH, AND SURFACE ENERGY CONTROL IN NANO FABRICATION

(71) Applicant: Facebook Technologies, LLC, Menlo Park, CA (US)

(72) Inventors: Nihar Ranjan Mohanty, Snoqualmie, WA (US); Matthieu Charles Raoul Leibovici, Seattle, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/036,722

(22) Filed: Jul. 16, 2018

(65) Prior Publication Data

US 2020/0018875 A1   Jan. 16, 2020

(51) Int. Cl.
  *G02B 5/18* (2006.01)
  *F21V 8/00* (2006.01)
  (Continued)

(52) U.S. Cl.
  CPC ............ *G02B 5/1857* (2013.01); *B82Y 40/00* (2013.01); *G02B 6/0016* (2013.01); *G02B 6/0036* (2013.01); *G03F 7/0002* (2013.01); *H01L 21/0337* (2013.01); *H01L 21/3065* (2013.01); *H01L 21/3086* (2013.01); *G02B 27/0172* (2013.01)

(58) Field of Classification Search
  None
  See application file for complete search history.

(56) References Cited

U.S. PATENT DOCUMENTS

2003/0034329 A1   2/2003   Chou
2005/0211547 A1   9/2005   Hanawa et al.
(Continued)

FOREIGN PATENT DOCUMENTS

EP   1183684        6/2008
JP   2011034648 A   2/2011
JP   2013251320 A   12/2013

OTHER PUBLICATIONS

J. Park et al., Proc. of SPIE vol. 8680, pp. 86802B-1 to 86802B-8. (Year: 2013).*

(Continued)

*Primary Examiner* — Jiong-Ping Lu
(74) *Attorney, Agent, or Firm* — Kilpatrick Townsend & Stockton LLP

(57) ABSTRACT

Techniques for fabricating slanted surface-relief structures are disclosed. In some embodiments, a method for of fabricating a target slanted surface-relief structure, such as a nanoimprint lithography (NIL) mold or a slanted surface-relief grating, includes manufacturing a preliminary surface-relief structure that includes a plurality of ridges and modifying a parameter of the preliminary surface-relief structure to make the target slanted surface-relief structure. The parameter includes a width of each of the plurality of ridges, a height of each of the plurality of ridges, a surface energy of the preliminary surface-relief structure, or a slant angle of an edge of the plurality of ridges. Modifying the parameter includes depositing a material layer on the preliminary surface-relief structure and etching or surface-treating the material layer.

14 Claims, 16 Drawing Sheets

(51) Int. Cl.
*G03F 7/00* (2006.01)
*B82Y 40/00* (2011.01)
*H01L 21/3065* (2006.01)
*H01L 21/033* (2006.01)
*H01L 21/308* (2006.01)
*G02B 27/01* (2006.01)

(56) References Cited

U.S. PATENT DOCUMENTS

| | | |
|---|---|---|
| 2006/0045987 A1 | 3/2006 | Chandler et al. |
| 2007/0158872 A1 | 7/2007 | Jeong et al. |
| 2010/0230864 A1* | 9/2010 | Park ............... B82Y 10/00 264/447 |
| 2013/0192758 A1 | 8/2013 | Toth et al. |
| 2014/0234466 A1 | 8/2014 | Gao et al. |
| 2015/0125976 A1 | 5/2015 | Wang |
| 2015/0279686 A1 | 10/2015 | Kuo et al. |
| 2016/0035539 A1 | 2/2016 | Sainiemi et al. |
| 2016/0042971 A1 | 2/2016 | Mohanty |
| 2016/0254369 A1* | 9/2016 | Yi ............... H01L 21/0276 438/696 |
| 2017/0059879 A1 | 3/2017 | Vallius |
| 2017/0311430 A1 | 10/2017 | Liang et al. |

OTHER PUBLICATIONS

W. Zhou, Nanoimprint Lithography: An Enabling Process for Nanofabrication, Chapter 4, Spring-Verlag, Berlin, pp. 87-88. (Year: 2013).*

V.M. Donnelly and A. Kornblit, "Plasma Etching: Yesterday, Today, and Tomorrow", J. Vac. Sci. Technol. vol. A31, pp. 050825-1 to 050825-48. (Year: 2013).*

International Application No. PCT/US2018/036515, International Search Report and Written Opinion dated Sep. 27, 2018, 15 pages.

Miller et al., "Design and Fabrication of Binary Slanted Surface-Relief Gratings for a Planar Optical Interconnection," Applied Optics, vol. 36, No. 23, Aug. 10, 1997, 12 pages.

International Application No. PCT/US2018/058272, "International Search Report and Written Opinion", dated Mar. 11, 2019, 14 pages.

International Application No. PCT/US2018/042488, "International Search Report and Written Opinion", dated Apr. 10, 2019, 11 pages.

* cited by examiner

DUTY CYCLE, DEPTH, AND SURFACE ENERGY CONTROL IN NANO FABRICATION

BACKGROUND

An artificial reality system, such as a head-mounted display (HMD) or heads-up display (HUD) system, generally includes a display configured to present artificial images that depict objects in a virtual environment. The display may display virtual objects or combine images of real objects with virtual objects, as in virtual reality (VR), augmented reality (AR), or mixed reality (MR) applications. For example, in an AR system, a user may view both images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through).

One example optical see-through AR system may use a waveguide-based optical display, where light of projected images may be coupled into a waveguide (e.g., a substrate), propagate within the waveguide, and be coupled out of the waveguide at different locations. In some implementations, the light of the projected images may be coupled into or out of the waveguide using a diffractive optical element, such as a slanted surface-relief grating. In many cases, it may be challenging to cost-effectively fabricate the slanted surface-relief grating with the desired profile at a desirable speed.

SUMMARY

This disclosure relates generally to techniques for fabricating slanted structures, and more specifically, to techniques for molding slant structures (e.g., slanted gratings), such as highly symmetrical slanted structures, slanted structures with large slant angles, or slanted structures with a high depth. The mold for molding the slanted structures may be fabricated by making a preliminary master mold and then fine-tuning the preliminary master mold using various processes to change the properties of the master mold, including, but not limited to, for example, the duty cycle, height or depth, ridge or groove profile of the structure on the master mold, or the surface energy of the master mold.

In some embodiments, a method of fabricating a nanoimprint lithography (NIL) mold with a target surface-relief structure may include manufacturing a preliminary surface-relief structure of the NIL mold, and modifying the parameter of the preliminary surface-relief structure to make the target surface-relief structure. The preliminary surface-relief structure may include a plurality of ridges, where a parameter of the preliminary surface-relief structure is different from a corresponding parameter of the target surface-relief structure. Modifying the parameter of the preliminary surface-relief structure may include depositing a material layer on the preliminary surface-relief structure, and etching or surface-treating the material layer. In some embodiments, the NIL mold may include a master NIL mold or a soft stamp for nanoimprint lithography. In some embodiments, the preliminary surface-relief structure may include a slanted surface-relief grating structure.

In some embodiments, the parameter of the preliminary surface-relief structure may include a width of each of the plurality of ridges. In some embodiments, modifying the parameter of the preliminary surface-relief structure may include depositing a spacer layer on the preliminary surface-relief structure, and anisotropically etching the spacer layer to remove the spacer layer on top of the plurality of ridges and the spacer layer between the plurality of ridges, and to keep the spacer layer on sidewalls of the plurality of ridges. In some embodiments, the etching may include plasma etching, ion beam etching, reactive ion beam etching, or chemical assisted reactive ion beam etching.

In some embodiments, the parameter of the preliminary surface-relief structure may include a height of each of the plurality of ridges. In some embodiments, modifying the parameter of the preliminary surface-relief structure may include depositing the material layer on the preliminary surface-relief structure using a vapor deposition process, and etching the material layer using a wet or dry isotropic etching process.

In some embodiments, the parameter of the preliminary surface-relief structure may include a surface energy of the preliminary surface-relief structure. In some embodiments, modifying the parameter of the preliminary surface-relief structure may include depositing a spacer layer on the preliminary surface-relief structure, where the spacer layer has a surface energy different from the surface energy of the preliminary surface-relief structure, and surface-treating the spacer layer. In some embodiments, surface-treating the spacer layer may include treating a surface of the spacer layer using hexamethyldisilazane (HMDS) or fluorinated self-assembled monolayer (FSAM).

In some embodiments, the plurality of ridges may include slanted ridges, and the parameter of the preliminary surface-relief structure may include a slant angle of an edge of the slanted ridges. In some embodiments, modifying the parameter of the preliminary surface-relief structure may include depositing a spacer layer on the preliminary surface-relief structure, and etching the spacer layer at a slanted angle using a plasma or ion beam.

In some embodiments, a method of fabricating a surface-relief grating may include manufacturing a preliminary surface-relief grating on a substrate and modifying the parameter of the preliminary surface-relief grating to make the surface-relief grating. The preliminary surface-relief grating may include a plurality of ridges, where a parameter of the preliminary surface-relief grating is different from a corresponding parameter of the surface-relief grating. Modifying the parameter of the preliminary surface-relief grating may include depositing a material layer on the preliminary surface-relief grating and etching the material layer. In some embodiments, the parameter of the preliminary surface-relief grating may include a width of each of the plurality of ridges, a height of each of the plurality of ridges, or a slant angle of an edge of each of the plurality of ridges. In some embodiments, a slant angle of an edge of each of the plurality of ridges is greater than 20°. In some embodiments, a depth of the plurality of ridges is greater than 20 nm.

In some embodiments, a method of fabricating a target nanoimprint lithography (NIL) mold may include manufacturing a preliminary NIL mold including a substrate and a plurality of ridges on the substrate, depositing a material layer on the preliminary NIL mold, and etching or surface-treating the material layer on the preliminary NIL mold to achieve the target NIL mold. In some embodiments, the depositing and the etching or surface-treating may modify at least one of a width of each of the plurality of ridges, a height of each of the plurality of ridges, a surface energy of the preliminary NIL mold, or a slant angle of an edge of the plurality of ridges. In some embodiments, the plurality of ridges may form a slanted surface-relief grating.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

Figure 1:
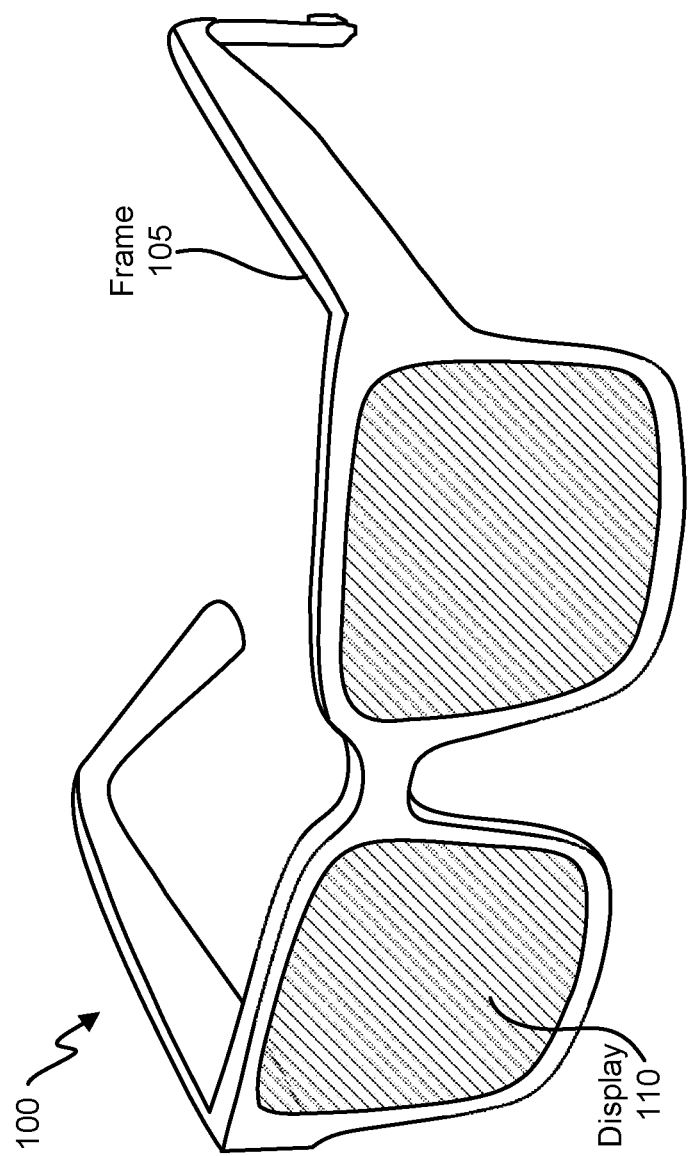
FIG. 1 is a simplified diagram of an example near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Techniques disclosed herein relate generally to micro- or nano-structure manufacturing. More specifically, and without limitation, this application relates to techniques for molding micro or nano-scale slanted structures. Slanted structures may be used in many optical or electronic devices for manipulating behavior of light and/or electricity. According to certain embodiments, slanted surface-relief gratings may be used in some optical devices, such as waveguide displays in artificial reality systems, to create high refractive index variations and high diffraction efficiencies. Some of the benefits of the slanted structures may include a high efficiency of light transfer, a large variation in refractive indices, and/or the like. It is found that parallel slanted structures with relatively large slant angles may solve problems unique to certain applications.

However, it may often be challenging to fabricate slanted structures with a large slant angle, a high depth, or similar slant angles for the leading edge and trailing edge of a ridge. In some implementations, nanoimprint lithography (NIL) process based on a master mold may be used to fabricate such slanted structures more efficiently and cost-effectively. Because the dimensions of the master mold affect the dimensions of every fabricated slanted structure, it is desirable to make the master mold as precise as possible. In some cases, it may be desirable to modify an existing master mold, for example, due to design changes or wearing of the fabricated master mold. In some cases, it may be desirable to modify (e.g., reduce) the surface energy of the master mold, for example, to reduce the adhesion of the master mold to the imprinted surfaces.

According to certain embodiments, a master mold for molding slanted structures may be fabricated by making a preliminary master mold and then fine-tuning the preliminary master mold using various processes to change the properties of the master mold, including, but not limited to, for example, the duty cycle, height or depth, ridge or groove profile of the structure of the master mold, or the surface energy of the master mold.

In some implementations, a stamp may be made from the master mold and used to mold the nano-structures. Similar techniques for modifying the master mold may be used to modify or fine-tune the stamp. In some embodiments, similar techniques may be used to modify or fine-tune a molded or otherwise manufactured nano-structure such that the final nano-structure may have the desired dimensions.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified diagram of an example near-eye display 100 according to certain embodiments. Near-eye display 100 may present media to a user. Examples of media presented by near-eye display 100 may include one or more images, video, and/or audio. In some embodiments, audio may be presented via an external device (e.g., speakers and/or headphones) that receives audio information from near-eye display 100, a console, or both, and presents audio data based on the audio information. Near-eye display 100 is generally configured to operate as an artificial reality display. In some embodiments, near-eye display 100 may operate as an augmented reality (AR) display or a mixed reality (MR) display.

Near-eye display 100 may include a frame 105 and a display 110. Frame 105 may be coupled to one or more optical elements. Display 110 may be configured for the user to see content presented by near-eye display 100. In some embodiments, display 110 may include a waveguide display assembly for directing light from one or more images to an eye of the user.

Figure 2:
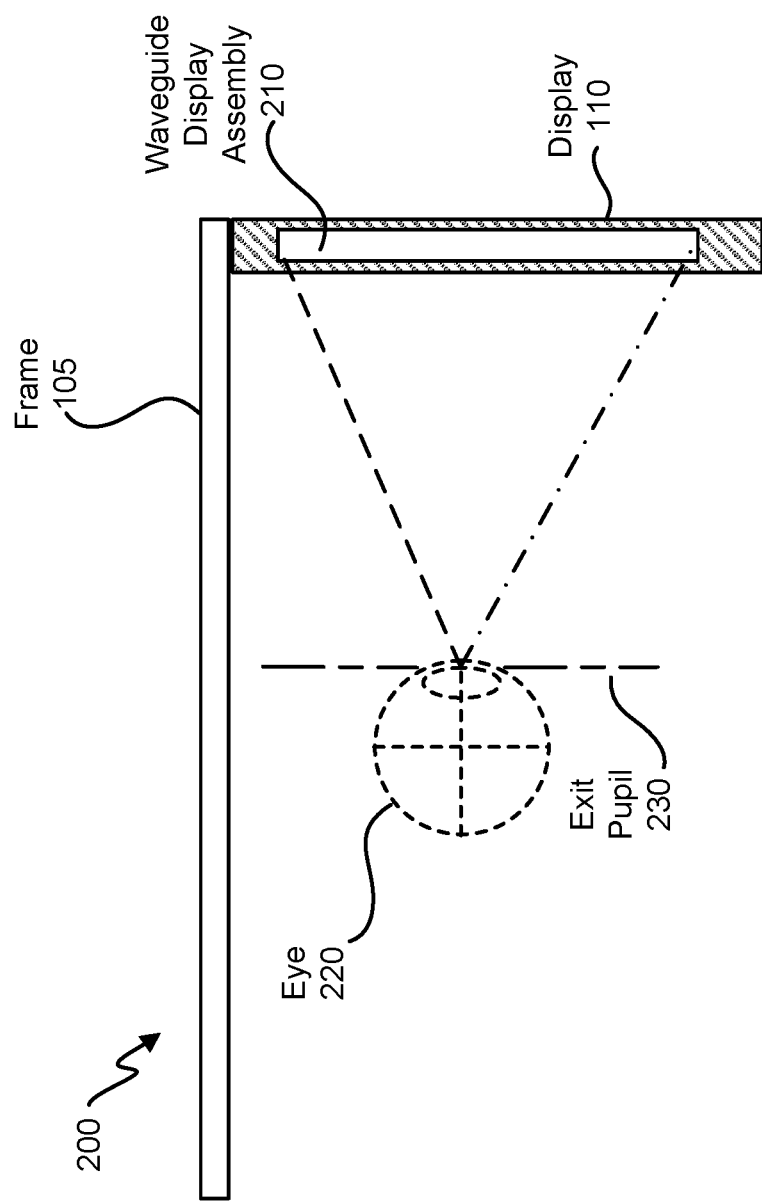
FIG. 2 is a cross-sectional view of an example near-eye display according to certain embodiments.

FIG. 2 is a cross-sectional view 200 of near-eye display 100 illustrated in FIG. 1. Display 110 may include may include at least one waveguide display assembly 210. An exit pupil 230 may be located at a location where a user's eye 220 is positioned when the user wears near-eye display 100. For purposes of illustration, FIG. 2 shows cross-sectional view 200 associated with user's eye 220 and a single waveguide display assembly 210, but, in some embodiments, a second waveguide display may be used for the second eye of the user.

Waveguide display assembly 210 may be configured to direct image light (i.e., display light) to an eyebox located at exit pupil 230 and to user's eye 220. Waveguide display assembly 210 may include one or more materials (e.g., plastic, glass, etc.) with one or more refractive indices. In some embodiments, near-eye display 100 may include one or more optical elements between waveguide display assembly 210 and user's eye 220.

In some embodiments, waveguide display assembly 210 may include a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display may also be a polychromatic display that can be projected on multiple planes (e.g. multi-planar colored display). In some configurations, the stacked waveguide display may be a monochromatic display that can be projected on multiple planes (e.g. multi-planar monochromatic display). The varifocal waveguide display is a display that can adjust a focal position of image light emitted from the waveguide display. In alternate embodiments, waveguide display assembly 210 may include the stacked waveguide display and the varifocal waveguide display.

Figure 3:
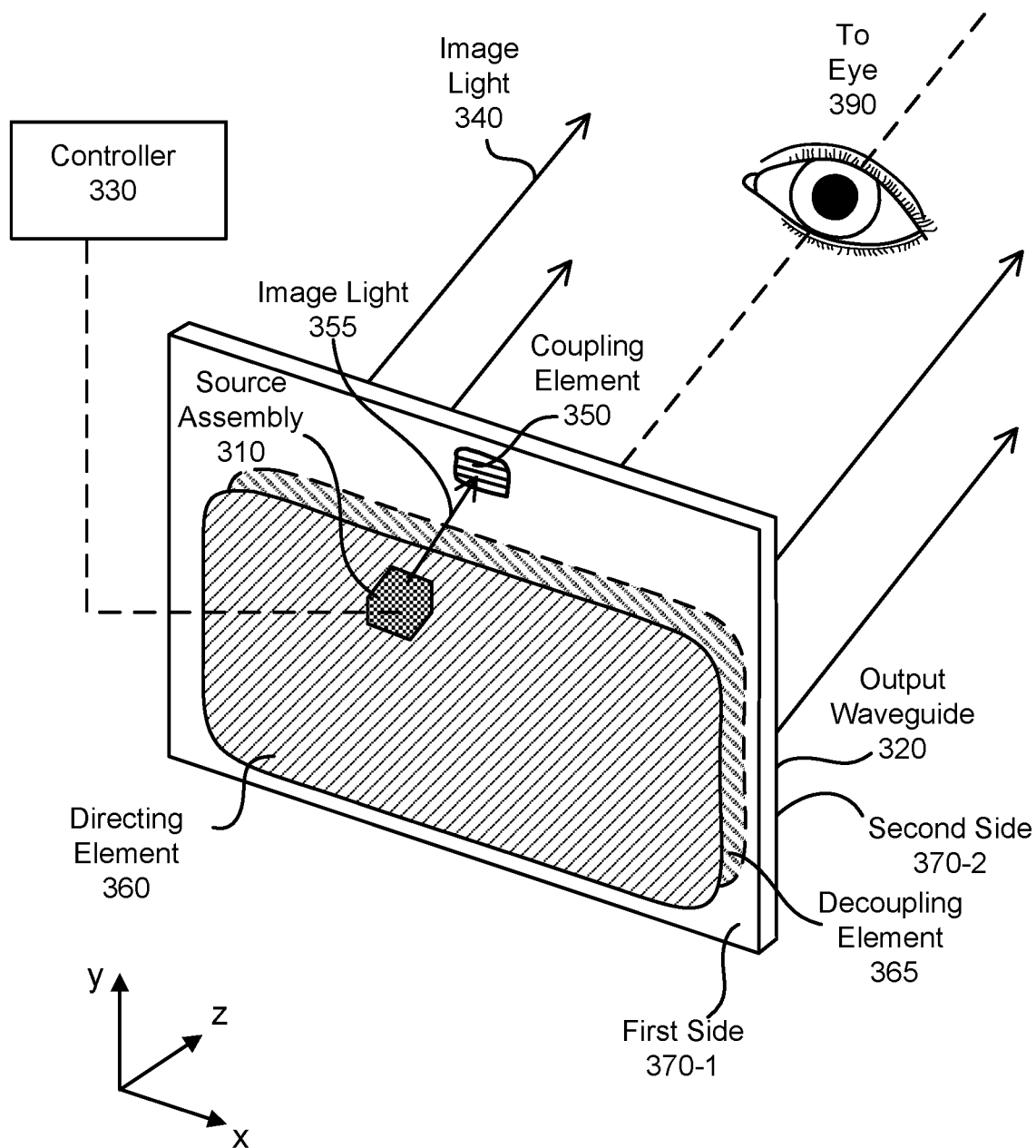
FIG. 3 is an isometric view of an example waveguide display according to certain embodiments.

FIG. 3 is an isometric view of an embodiment of a waveguide display 300. In some embodiments, waveguide display 300 may be a component (e.g., waveguide display assembly 210) of near-eye display 100. In some embodiments, waveguide display 300 may be part of some other near-eye displays or other systems that may direct image light to a particular location.

Waveguide display 300 may include a source assembly 310, an output waveguide 320, and a controller 330. For purposes of illustration, FIG. 3 shows waveguide display 300 associated with a user's eye 390, but in some embodiments, another waveguide display separate, or partially separate, from waveguide display 300 may provide image light to another eye of the user.

Source assembly 310 may generate image light 355 for display to the user. Source assembly 310 may generate and output image light 355 to a coupling element 350 located on a first side 370-1 of output waveguide 320. In some embodiments, coupling element 350 may couple image light 355 from source assembly 310 into output waveguide 320. Coupling element 350 may include, for example, a diffraction grating, a holographic grating, one or more cascaded reflectors, one or more prismatic surface elements, and/or an array of holographic reflectors. Output waveguide 320 may be an optical waveguide that can output expanded image light 340 to user's eye 390. Output waveguide 320 may receive image light 355 at one or more coupling elements 350 located on first side 370-1 and guide received image light 355 to a directing element 360.

Directing element 360 may redirect received input image light 355 to decoupling element 365 such that received input image light 355 may be coupled out of output waveguide 320 via decoupling element 365. Directing element 360 may be part of, or affixed to, first side 370-1 of output waveguide 320. Decoupling element 365 may be part of, or affixed to, a second side 370-2 of output waveguide 320, such that directing element 360 is opposed to decoupling element 365. Directing element 360 and/or decoupling element 365 may include, for example, a diffraction grating, a holographic grating, a surface-relief grating, one or more cascaded reflectors, one or more prismatic surface elements, and/or an array of holographic reflectors.

Second side 370-2 of output waveguide 320 may represent a plane along an x-dimension and a y-dimension. Output waveguide 320 may include one or more materials that can facilitate total internal reflection of image light 355. Output waveguide 320 may include, for example, silicon, plastic, glass, and/or polymers. Output waveguide 320 may have a relatively small form factor. For example, output waveguide 320 may be approximately 50 mm wide along the x-dimension, about 30 mm long along the y-dimension, and about 0.5 to 1 mm thick along a z-dimension.

Controller 330 may control scanning operations of source assembly 310. Controller 330 may determine scanning instructions for source assembly 310. In some embodiments, output waveguide 320 may output expanded image light 340 to user's eye 390 with a large field of view (FOV). For example, expanded image light 340 provided to user's eye 390 may have a diagonal FOV (in x and y) of about 60 degrees or greater and/or about 150 degrees or less. Output waveguide 320 may be configured to provide an eyebox with a length of about 20 mm or greater and/or equal to or less than about 50 mm, and/or a width of about 10 mm or greater and/or equal to or less than about 50 mm.

Figure 4:
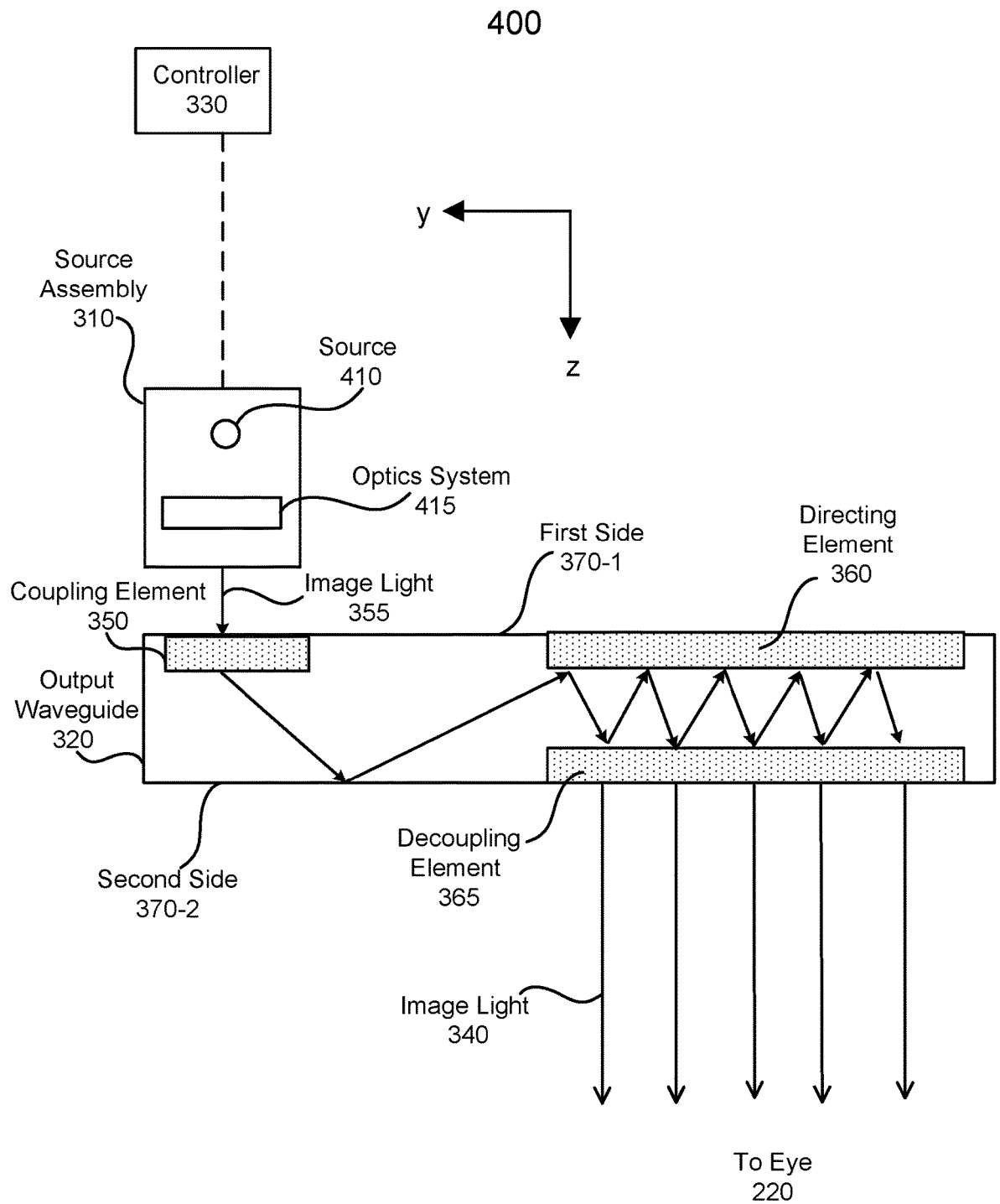
FIG. 4 is a cross-sectional view of an example waveguide display according to certain embodiments.

FIG. 4 is a cross-sectional view 400 of waveguide display 300. Waveguide display 300 may include source assembly 310 and output waveguide 320. Source assembly 310 may generate image light 355 (i.e., display light) in accordance with scanning instructions from controller 330. Source assembly 310 may include a source 410 and an optics system 415. Source 410 may include a light source that generates coherent or partially coherent light. Source 410 may include, for example, a laser diode, a vertical cavity surface emitting laser, and/or a light emitting diode.

Optics system 415 may include one or more optical components that can condition the light from source 410. Conditioning light from source 410 may include, for example, expanding, collimating, and/or adjusting orientation in accordance with instructions from controller 330. The one or more optical components may include one or more lenses, liquid lenses, mirrors, apertures, and/or gratings. Light emitted from optics system 415 (and also source assembly 310) may be referred to as image light 355 or display light.

Output waveguide 320 may receive image light 355 from source assembly 310. Coupling element 350 may couple image light 355 from source assembly 310 into output waveguide 320. In embodiments where coupling element 350 includes a diffraction grating, the diffraction grating may be configured such that total internal reflection may occur within output waveguide 320, and thus image light 355 coupled into output waveguide 320 may propagate internally within output waveguide 320 (e.g., by total internal reflection) toward decoupling element 365.

Directing element 360 may redirect image light 355 toward decoupling element 365 for coupling at least a portion of the image light out of output waveguide 320. In embodiments where directing element 360 is a diffraction grating, the diffraction grating may be configured to cause incident image light 355 to exit output waveguide 320 at angle(s) of inclination relative to a surface of decoupling element 365. In some embodiments, directing element 360 and/or the decoupling element 365 may be structurally similar.

Expanded image light 340 exiting output waveguide 320 may be expanded along one or more dimensions (e.g., elongated along the x-dimension). In some embodiments, waveguide display 300 may include a plurality of source assemblies 310 and a plurality of output waveguides 320. Each of source assemblies 310 may emit a monochromatic image light corresponding to a primary color (e.g., red, green, or blue). Each of output waveguides 320 may be stacked together to output an expanded image light 340 that may be multi-colored.

Figure 5:
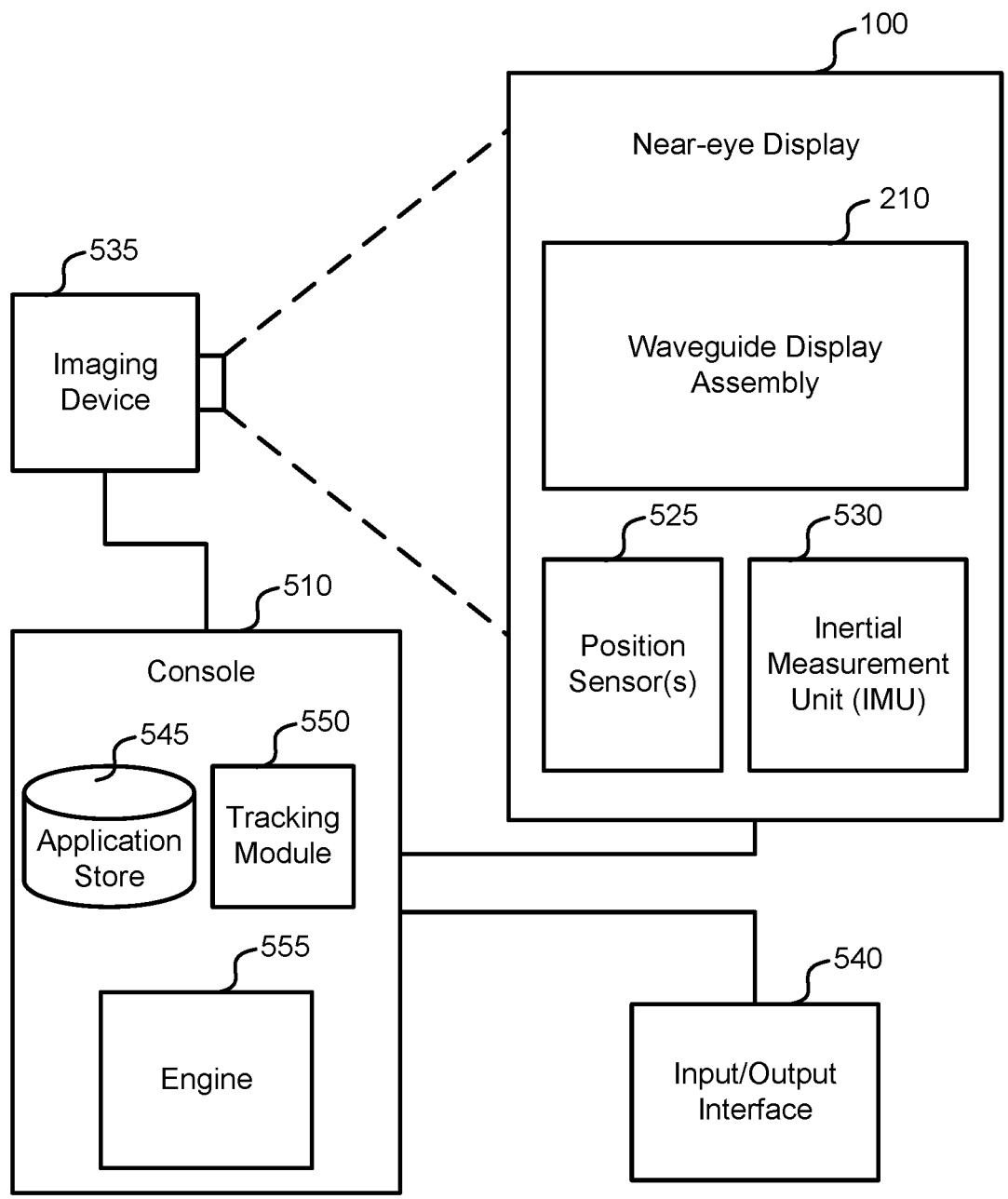
FIG. 5 is a simplified block diagram of an example artificial reality system including a waveguide display.

FIG. 5 is a simplified block diagram of an example artificial reality system 500 including waveguide display assembly 210. System 500 may include near-eye display 100, an imaging device 535, and an input/output interface 540 that are each coupled to a console 510.

As described above, near-eye display 100 may be a display that presents media to a user. Examples of media presented by near-eye display 100 may include one or more images, video, and/or audio. In some embodiments, audio may be presented via an external device (e.g., speakers and/or headphones) that may receive audio information from near-eye display 100 and/or console 510 and present audio data based on the audio information to a user. In some embodiments, near-eye display 100 may act as an artificial reality eyewear glass. For example, in some embodiments, near-eye display 100 may augment views of a physical, real-world environment, with computer-generated elements (e.g., images, video, sound, etc.).

Near-eye display 100 may include waveguide display assembly 210, one or more position sensors 525, and/or an inertial measurement unit (IMU) 530. Waveguide display assembly 210 may include a waveguide display, such as waveguide display 300 that includes source assembly 310, output waveguide 320, and controller 330 as described above.

IMU 530 may include an electronic device that can generate fast calibration data indicating an estimated position of near-eye display 100 relative to an initial position of near-eye display 100 based on measurement signals received from one or more position sensors 525.

Imaging device 535 may generate slow calibration data in accordance with calibration parameters received from console 510. Imaging device 535 may include one or more cameras and/or one or more video cameras.

Input/output interface 540 may be a device that allows a user to send action requests to console 510. An action request may be a request to perform a particular action. For example, an action request may be to start or end an application or to perform a particular action within the application.

Console 510 may provide media to near-eye display 100 for presentation to the user in accordance with information received from one or more of: imaging device 535, near-eye display 100, and input/output interface 540. In the example shown in FIG. 5, console 510 may include an application store 545, a tracking module 550, and an engine 555.

Application store 545 may store one or more applications for execution by the console 510. An application may include a group of instructions that, when executed by a processor, may generate content for presentation to the user. Examples of applications may include gaming applications, conferencing applications, video playback application, or other suitable applications.

Tracking module 550 may calibrate system 500 using one or more calibration parameters and may adjust one or more calibration parameters to reduce error in determination of the position of near-eye display 100. Tracking module 550 may track movements of near-eye display 100 using slow calibration information from imaging device 535. Tracking module 550 may also determine positions of a reference point of near-eye display 100 using position information from the fast calibration information.

Engine 555 may execute applications within system 500 and receives position information, acceleration information, velocity information, and/or predicted future positions of near-eye display 100 from tracking module 550. In some embodiments, information received by engine 555 may be used for producing a signal (e.g., display instructions) to waveguide display assembly 210. The signal may determine a type of content to present to the user.

There may be many different ways to implement the waveguide display. For example, in some implementations, output waveguide 320 may include a slanted surface between first side 370-1 and second side 370-2 for coupling image light 355 into output waveguide 320. In some implementations, the slanted surface may be coated with a reflective coating to reflect light towards directing element 360. In some implementations, the angle of the slanted surface may be configured such that image light 355 may be reflected by the slanted surface due to total internal reflection. In some implementations, directing element 360 may not be used, and light may be guided within output waveguide 320 by total internal reflection. In some implementations, decoupling elements 365 may be located near first side 370-1.

In some implementations, output waveguide 320 and decoupling element 365 (and directing element 360 if used) may be transparent to light from the environment, and may act as an optical combiner for combining image light 355 and light from the physical, real-world environment in front of near-eye display 100. As such, the user can view both artificial images of artificial objects from source assembly 310 and real images of real objects in the physical, real-world environment, which may be referred to as optical see-through.

Figure 6:
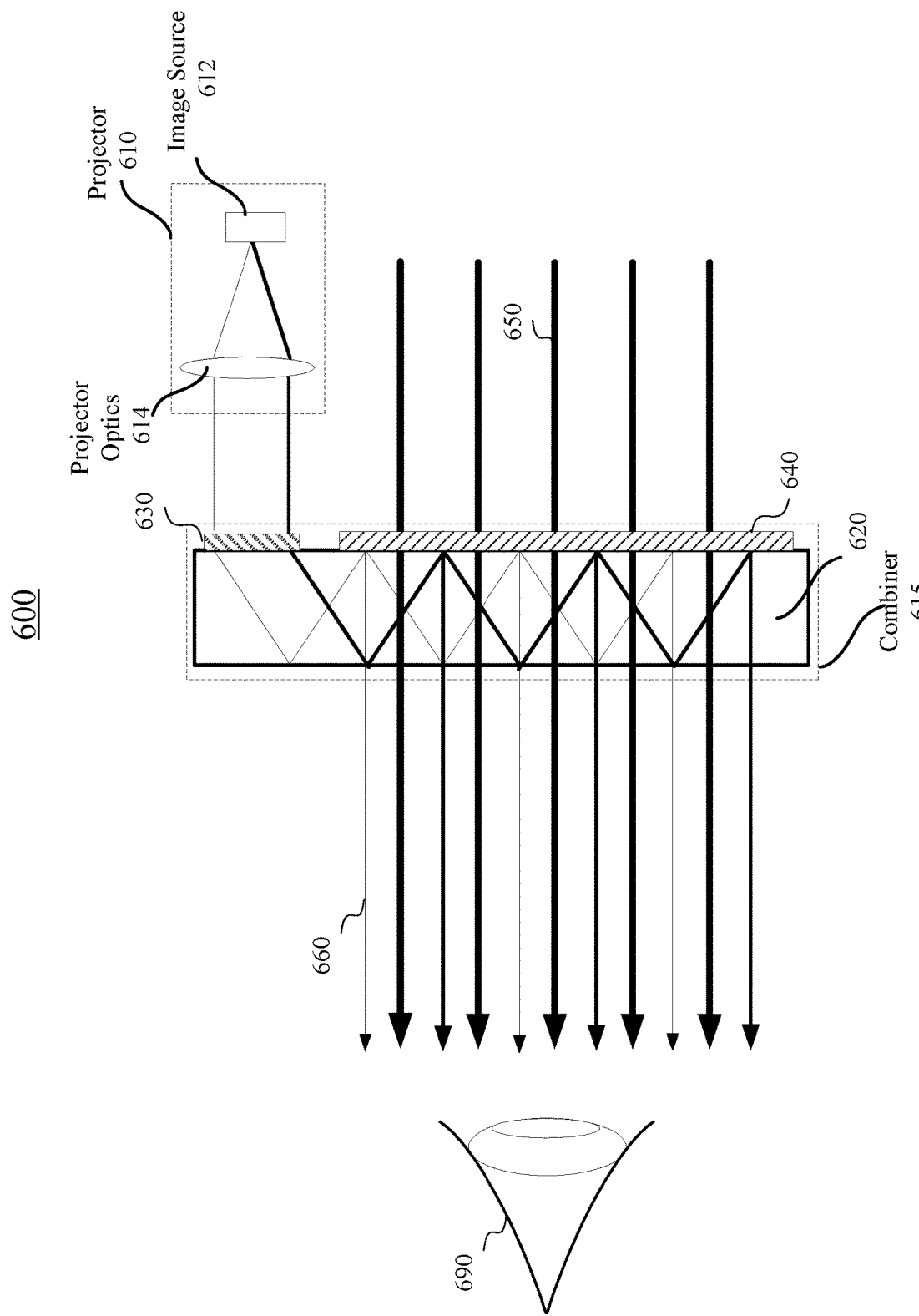
FIG. 6 illustrates an example optical see-through augmented reality system using a waveguide display according to certain embodiments.

FIG. 6 illustrates an example optical see-through augmented reality system 600 using a waveguide display according to certain embodiments. Augmented reality system 600 may include a projector 610 and a combiner 615. Projector 610 may include a light source or image source 612 and projector optics 614. In some embodiments, image source 612 may include a plurality of pixels that displays virtual objects, such as an LCD display panel or an LED display panel. In some embodiments, image source 612 may include a light source that generates coherent or partially coherent light. For example, image source 612 may include a laser diode, a vertical cavity surface emitting laser, and/or a light emitting diode. In some embodiments, image source 612 may include a plurality of light sources each emitting a monochromatic image light corresponding to a primary color (e.g., red, green, or blue). In some embodiments, image source 612 may include an optical pattern generator, such as a spatial light modulator. Projector optics 614 may include one or more optical components that can condition the light from image source 612, such as expanding, collimating, scanning, or projecting light from image source 612 to combiner 615. The one or more optical components may include, for example, one or more lenses, liquid lenses, mirrors, apertures, and/or gratings. In some embodiments, projector optics 614 may include a liquid lens (e.g., a liquid crystal lens) with a plurality of electrodes that allows scanning of the light from image source 612.

Combiner 615 may include an input coupler 630 for coupling light from projector 610 into a substrate 620 of combiner 615. Input coupler 630 may include a volume holographic grating, a diffractive optical elements (DOE) (e.g., a surface-relief grating), or a refractive coupler (e.g., a wedge or a prism). Input coupler 630 may have a coupling efficiency of greater than 30%, 50%, 75%, 90%, or higher for visible light. As used herein, visible light may refer to light with a wavelength between about 380 nm to about 750 nm. Light coupled into substrate 620 may propagate within substrate 620 through, for example, total internal reflection (TIR). Substrate 620 may be in the form of a lens of a pair of eyeglasses. Substrate 620 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 620 may be transparent to visible light. A material may be "transparent" to a light beam if the light beam can pass through the material with a high transmission rate, such as larger than 50%, 60%, 75%, 80%, 90%, 95%, or higher, where a small portion of the light beam (e.g., less than 50%, 40%, 25%, 20%, 10%, 5%, or less) may be scattered, reflected, or absorbed by the material. The transmission rate (i.e., transmissivity) may be represented by either a photopically weighted or an unweighted average transmission rate over a range of wavelengths, or the lowest transmission rate over a range of wavelengths, such as the visible wavelength range.

Substrate 620 may include or may be coupled to a plurality of output couplers 640 configured to extract at least a portion of the light guided by and propagating within substrate 620 from substrate 620, and direct extracted light 660 to an eye 690 of the user of augmented reality system 600. As input coupler 630, output couplers 640 may include grating couplers (e.g., volume holographic gratings or surface-relief gratings), other DOEs, prisms, etc. Output couplers 640 may have different coupling (e.g., diffraction) efficiencies at different locations. Substrate 620 may also allow light 650 from environment in front of combiner 615 to pass through with little or no loss. Output couplers 640 may also allow light 650 to pass through with little loss. For example, in some implementations, output couplers 640 may have a low diffraction efficiency for light 650 such that light 650 may be refracted or otherwise pass through output couplers 640 with little loss, and thus may have a higher intensity than extracted light 660. In some implementations, output couplers 640 may have a high diffraction efficiency for light 650 and may diffract light 650 to certain desired directions (i.e., diffraction angles) with little loss. As a result, the user may be able to view combined images of the environment in front of combiner 615 and virtual objects projected by projector 610.

Figure 7:
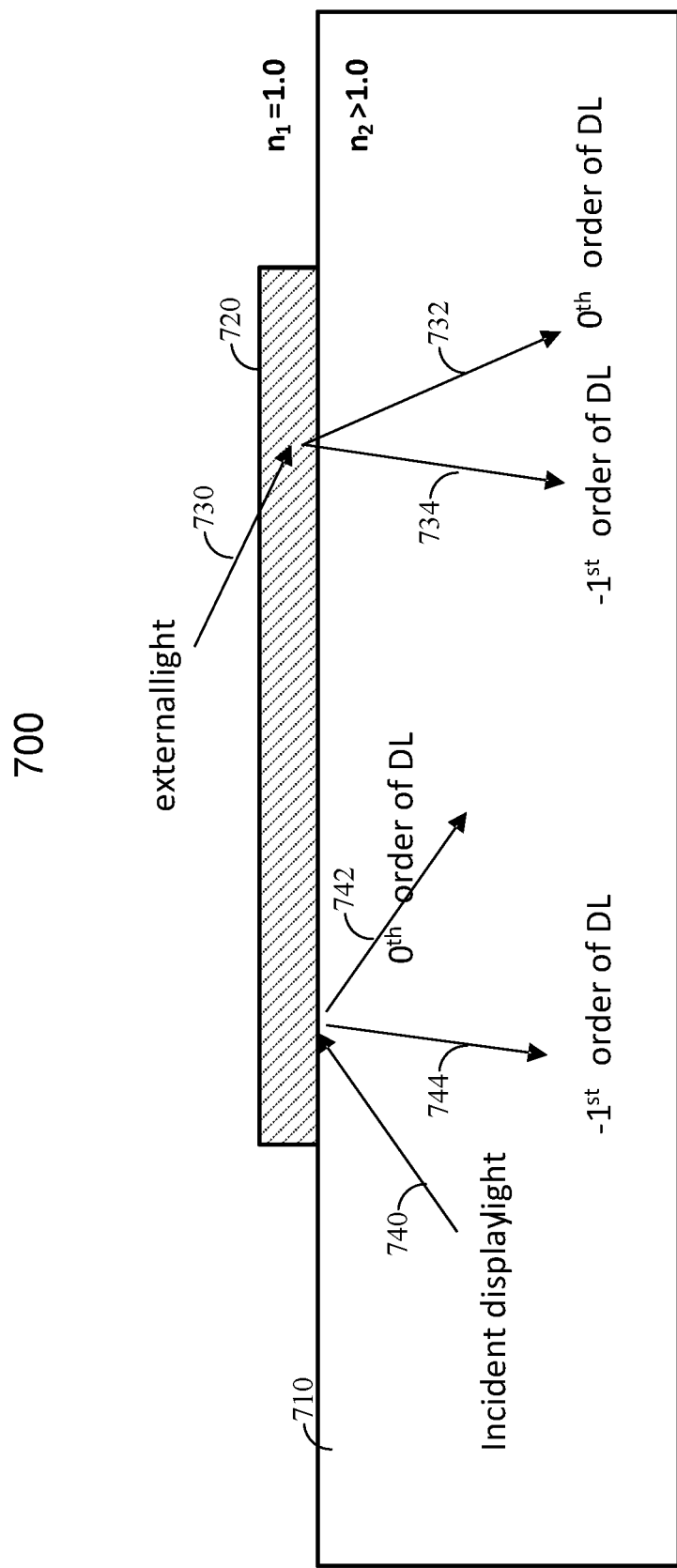
FIG. 7 illustrates propagations of display light and external light in an example waveguide display.

FIG. 7 illustrates propagations of incident display light 740 and external light 730 in an example waveguide display 700 including a waveguide 710 and a grating coupler 720. Waveguide 710 may be a flat or curved transparent substrate with a refractive index $n_2$ greater than the free space refractive index $n_1$ (i.e., 1.0). Grating coupler 720 may include, for example, a Bragg grating or a surface-relief grating.

Incident display light 740 may be coupled into waveguide 710 by, for example, input coupler 630 of FIG. 6 or other couplers (e.g., a prism or slanted surface) described above. Incident display light 740 may propagate within waveguide 710 through, for example, total internal reflection. When incident display light 740 reaches grating coupler 720, incident display light 740 may be diffracted by grating coupler 720 into, for example, a $0^{th}$ order diffraction (i.e., reflection) light 742 and a −1st order diffraction light 744. The $0^{th}$ order diffraction may continue to propagate within waveguide 710, and may be reflected by the bottom surface of waveguide 710 towards grating coupler 720 at a different location. The −1st order diffraction light 744 may be coupled (e.g., refracted) out of waveguide 710 towards the user's eye, because a total internal reflection condition may not be met at the bottom surface of waveguide 710 due to the diffraction angle of the $-1^{st}$ order diffraction light 744.

External light 730 may also be diffracted by grating coupler 720 into, for example, a $0^{th}$ order diffraction light 732 or a −1st order diffraction light 734. The $0^{th}$ order diffraction light 732 or the −1st order diffraction light 734 may be refracted out of waveguide 710 towards the user's eye. Thus, grating coupler 720 may act as an input coupler for coupling external light 730 into waveguide 710, and may also act as an output coupler for coupling incident display light 740 out of waveguide 710. As such, grating coupler 720 may act as a combiner for combining external light 730 and incident display light 740 and send the combined light to the user's eye.

In order to diffract light at a desired direction towards the user's eye and to achieve a desired diffraction efficiency for certain diffraction orders, grating coupler 720 may include a blazed or slanted grating, such as a slanted Bragg grating or surface-relief grating, where the grating ridges and grooves may be tilted relative to the surface normal of grating coupler 720 or waveguide 710.

Figure 8:
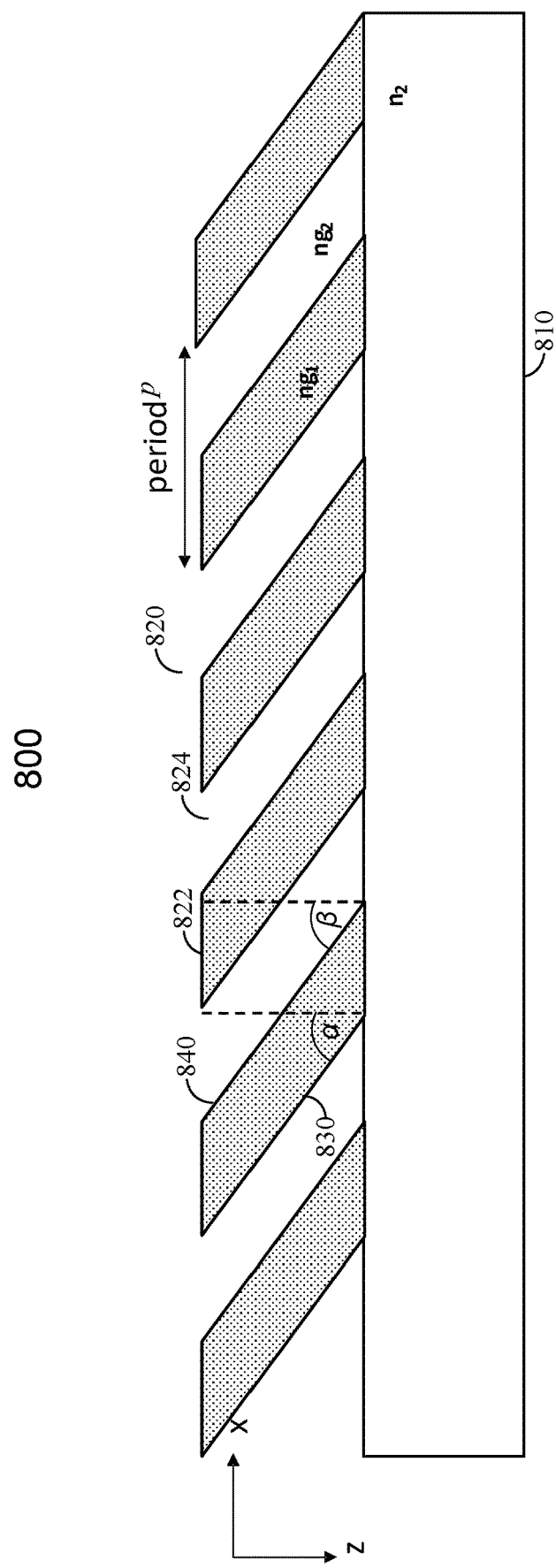
FIG. 8 illustrates an example slanted grating coupler in an example waveguide display according to certain embodiments.

FIG. 8 illustrates an example slanted grating 820 in an example waveguide display 800 according to certain embodiments. Waveguide display 800 may include slanted grating 820 on a waveguide 810, such as substrate 620. Slanted grating 820 may act as a grating coupler for couple light into or out of waveguide 810. In some embodiments, slanted grating 820 may include a periodic structure with a period p. For example, slanted grating 820 may include a plurality of ridges 822 and grooves 824 between ridges 822. Each period of slanted grating 820 may include a ridge 822 and a groove 824, which may be an air gap or a region filled with a material with a refractive index $n_{g2}$. The ratio between the width of a ridge 822 and the grating period p may be referred to as duty cycle. Slanted grating 820 may have a duty cycle ranging, for example, from about 10% to about 90% or greater. In some embodiments, the duty cycle may vary from period to period. In some embodiments, the period p of the slanted grating may vary from one area to another on slanted grating 820, or may vary from one period to another (i.e., chirped) on slanted grating 820.

Ridges 822 may be made of a material with a refractive index of $n_{g1}$, such as silicon containing materials (e.g., $SiO_2$, $Si_3N_4$, SiC, $SiO_xN_y$, or amorphous silicon), organic materials (e.g., spin on carbon (SOC) or amorphous carbon layer (ACL) or diamond like carbon (DLC)), or inorganic metal oxide layers (e.g., $TiO_x$, $AlO_x$, $TaO_x$, $HfO_x$, etc.). Each ridge 822 may include a leading edge 830 with a slant angle α and a trailing edge 840 with a slant angle β In some embodiments, leading edge 830 and training edge 840 of each ridge 822 may be parallel to each other. In other words, slant angle α is approximately equal to slant angle β. In some embodiments, slant angle α may be different from slant angle β In some embodiments, slant angle α may be approximately equal to slant angle β For example, the difference between slant angle α and slant angle β may be less than 20%, 10%, 5%, 1%, or less. In some embodiments, slant angle α and slant angle β may range from, for example, about 30° or less to about 70° or larger.

In some implementations, grooves 824 between the ridges 822 may be over-coated or filled with a material having a refractive index $n_{g2}$ higher or lower than the refractive index of the material of ridges 822. For example, in some embodiments, a high refractive index material, such as Hafnia, Titania, Tantalum oxide, Tungsten oxide, Zirconium oxide, Gallium sulfide, Gallium nitride, Gallium phosphide, silicon, and a high refractive index polymer, may be used to fill grooves 824. In some embodiments, a low refractive index material, such as silicon oxide, alumina, porous silica, or fluorinated low index monomer (or polymer), may be used to fill grooves 824. As a result, the difference between the refractive index of the ridges and the refractive index of the grooves may be greater than 0.1, 0.2, 0.3, 0.5, 1.0, or higher.

The slanted grating may be fabricated using many different nanofabrication techniques. The nanofabrication techniques generally include a patterning process and a post-patterning (e.g., over-coating) process. The patterning process may be used to form slanted ridges of the slanted grating. There may be many different nanofabrication techniques for forming the slanted ridges. For example, in some implementations, the slanted grating may be fabricated using lithography techniques including slanted etching. In some implementations, the slanted grating may be fabricated using nanoimprint lithography (NIL) from a master mold fabricated using techniques described herein. The post-patterning process may be used to over-coat the slanted ridges and/or to fill the gaps between the slanted ridges with a material having a different refractive index than the slanted ridges. The post-patterning process may be independent from the patterning process. Thus, a same post-patterning process may be used on slanted gratings fabricated using any pattering technique.

Nanoimprint lithography techniques have started to be used to fabricate nano-structures because it overcomes some limitations of electron beam lithography and photolithography, and can offer effectively controllable shapes of fabricated elements, high resolution, and cost-effectiveness. In NIL, patterns may be created by mechanically deforming imprint resist that may be thermally curable (e.g., thermoplastic material) or UV curable. For example, in thermoplastic NIL, a thin layer of imprint resist may be spin-coated or otherwise deposited on a substrate, a mold with pre-defined topological patterns may be pressed onto the resist-coated substrate while the temperature is increased (e.g., above the glass transition temperature) and the pressure is elevated. As a result, the pattern on the mold may be transferred to the imprint resist. After being cooled down, the resist may harden. The mold may then be separated from the substrate to leave the patterned resist on the substrate. The pattern in the resist on the substrate may thus be complementary to the pattern on the mold. In some embodiments, a UV curable resist, rather than a thermoplastic material, may be used as the imprint resist. In some embodiments where UV curable resists are used, the NIL mold may include a UV-transparent material, such as quartz or fused silica.

Figure 9:
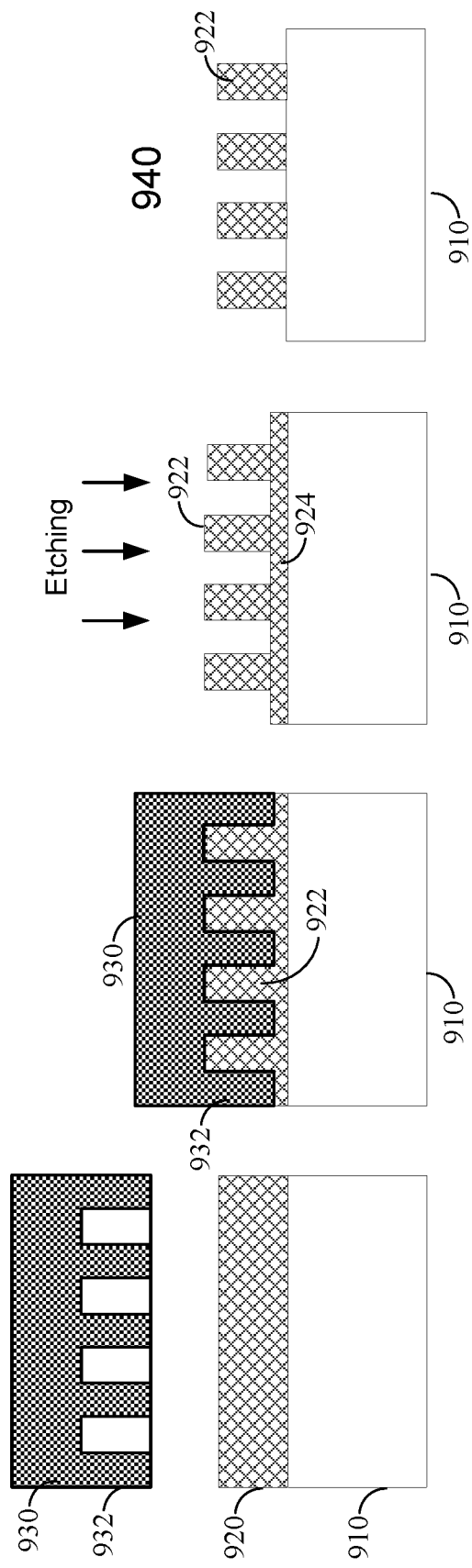
FIGS. 9A-9D illustrate an example process for fabricating a slanted surface-relief grating by nanoimprint lithography according to certain embodiments.

FIG. 9A-9D illustrate an example process for fabricating a slanted surface-relief grating by nanoimprint lithography according to certain embodiments. In FIG. 9A, a waveguide 910 (e.g., a glass or quartz substrate) may be coated with a NIL resin layer 920. NIL resin layer 920 may include, for example, a polymer (e.g., poly(methyl methacrylate) (PMMA)), a butyl-acrylate based resin doped with a resin comprising a sol-gel precursor (e.g., titanium butoxide), a monomer containing a reactive functional group for subsequent infusion processes (such as acrylic acid), and/or high refractive index nanoparticles (e.g., $ZrO_2$, $WO_2$, $MoO_2$, $TiO_2$, GaP, $HfO_2$, GaAs, etc.). NIL resin layer 920 may be deposited on waveguide 910 by, for example, spin-coating, lamination, or ink injection. A NIL mold 930 with ridges 932 may be pressed against NIL resin layer 920 and waveguide 910 for molding a nano-structure in NIL resin layer 920. In some implementations, NIL mold 930 may be a hard mold and may include a rigid material, such as silicon, silicon dioxide, quartz, fused silica, GaAs, silicon nitride, or metals (e.g., nickel). In some implementations, NIL mold 930 may be a replication of a master mold or a complement to the master mode, and may include soft or flexible materials (i.e., a soft mold), such as polymer-based materials, including, for example, polydimethylsiloxane (PDMS), ethylene tetrafluoroethylene (ETFE), or polyethylene terephthalate (PET). In some embodiments, ridges 932 may be slanted.

FIG. 9B is an example diagram illustrating transferring a nano-structure from NIL mold 930 to NIL resin layer 920 by compressing NIL mold 930 into softened NIL resin layer 920. NIL resin layer 920 may be heated to increase its temperature above the glass transition temperature (Tg), at which point NIL resin layer 920 may be softened. NIL mold 930 may then be pressed against NIL resin layer 920 to transfer the pattern on NIL mold 930 to NIL resin layer 920 and form ridges 922 of the pattern in NIL resin layer 920. As described above, NIL resin layer 920 may be cured (cross-linked) subsequently using, for example, heat and/or ultraviolet (UV) light. NIL resin layer 920, NIL mold 930, and waveguide 910 may then be cooled down to harden NIL resin layer 920. Afterwards, NIL mold 930 may be removed (lifted off) from NIL resin layer 920. A nano-structure including ridges 922 may be left on waveguide 910.

FIG. 9C illustrates an example etching process to remove a residual NIL resin layer 924 of NIL resin layer 920 after NIL mold 930 is detached from NIL resin layer 920 and waveguide 910. In some implementations, the etching may include, for example, plasma etching, reactive ion etching (ME), neutral beam etching (NBE) reactive ion beam etching (RIBE), chemical assisted ion beam etching (CAIBE), or any combination thereof. In some implementations, the etching may be anisotropic. The etching may remove residual NIL resin layer 924 and expose regions of waveguide 910 that are compressed by ridges 932 of NIL mold 930.

FIG. 9D illustrates the imprinted structure on waveguide 910. As shown in FIG. 9D, residual NIL resin layer 924 and ridges 922 may be etched, and residual NIL resin materials in regions that are pressed by ridges 932 of NIL mold 930 may be removed to expose waveguide 910. A resultant imprinted device 940 including ridges 922 on waveguide 910 may be formed after residual NIL resin layer 924 is etched.

In some embodiments, imprinted device 940 may be over-coated or filled with a material having a refractive index $n_{g2}$ higher or lower than the refractive index of the material of ridges 922. For example, in some embodiments, a high refractive index material, such as Hafnia, Titania, Tantalum oxide, Tungsten oxide, Zirconium oxide, Gallium sulfide, Gallium nitride, Gallium phosphide, silicon, and a high refractive index polymer, may be used to fill grooves between ridges 922. In some embodiments, a low refractive index material, such as silicon oxide, alumina, porous silica, or fluorinated low index monomer (or polymer), may be used to fill grooves between ridges 922. As a result, the difference between the refractive index of the ridges and the refractive index of the grooves may be greater than 0.1, 0.2, 0.3, 0.5, 1.0, or higher.

Because the imprinted structure on imprinted device 940 are generally complementary to the structure on NIL mold 930, any errors or defects on NIL mold 930 may be directly transferred to imprinted device 940. Thus, it is desirable to have a mold (hard mold or soft mold) as precise and accurate as possible. Even though hard molds made of rigid materials may be thermally and mechanically stable, they may be easily broken when compressed or lifted off due to their stiffness, may be difficult for defect control, and may be worn out after multiple imprint processes due to, for example, the adhesion between the mold and the imprinted structure. One way to reduce the wearing or damage of the mold is to use a mold having a low surface energy or suitable for anti-adhesion surface treatment such that the adhesion between the mold and the surfaces of the imprinted structure may be reduced. In some cases, it may be desirable to modify an existing mold, for example, due to design changes or defects (or damages) in a fabricated master mold.

According to certain embodiments, a master mold for molding slanted structure may be fabricated by making a preliminary master mold and then fine-tuning the preliminary master mold using various processes to change the properties of the master mold, including, but not limited to, for example, duty cycle, height or depth, ridge or groove profile, or surface energy. In some implementations, similar techniques for modifying the master mold may be used to modify or fine-tune a mold (e.g., a soft stamp) made from the master mold and used to mold the nano-structures. In some embodiments, similar techniques may be used to modify or fine-tune molded or otherwise manufactured nano-structures such that the final nano-structures may have the desired dimensions.

Techniques and processes for modifying the master mold, soft stamp, or imprinted device described below are for illustration purposes only and are not intended to be limiting. A person skilled in the art would understand that various modifications may be made to the techniques described below. For example, in some implementations, some operations described below may be omitted. In some implementations, additional operations may be performed to fabricate the mold. Techniques disclosed herein may be used to modify master molds, soft stamps, or imprinted devices made using various materials.

Figure 10:
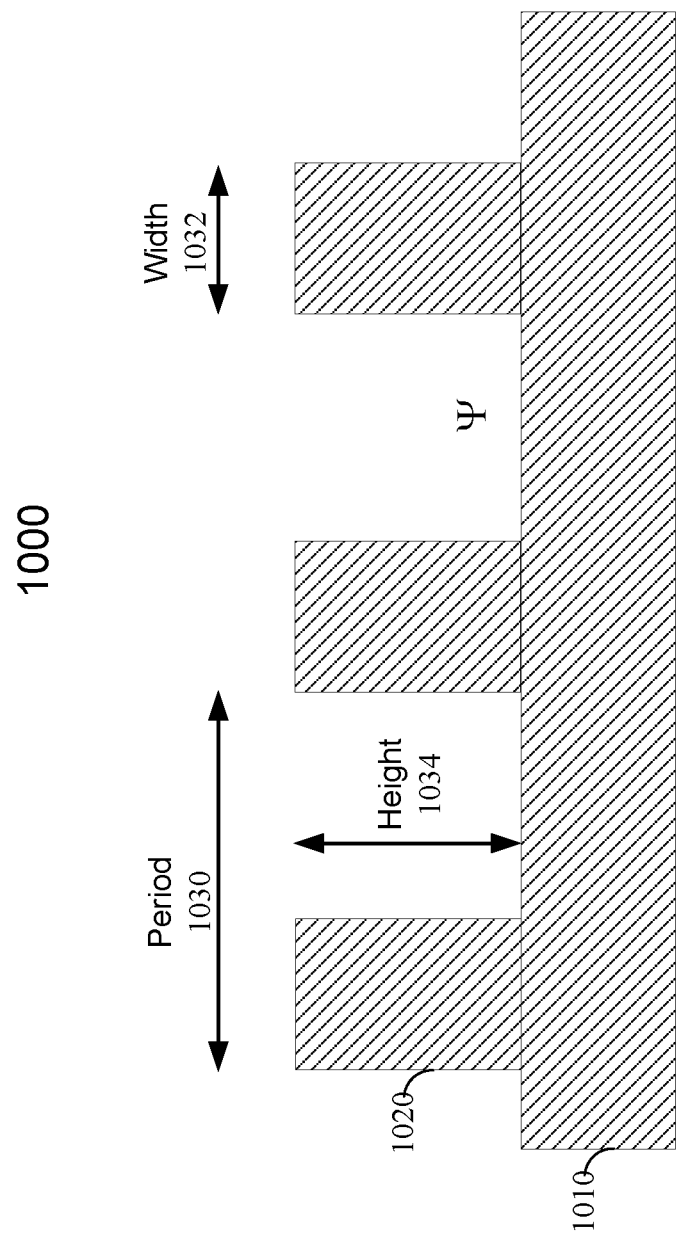
FIG. 10 illustrates an example master mold for fabricating nano-structures according to certain embodiments.

FIG. 10 illustrates an example master mold 1000 for fabricating nano-structures, such as slanted surface-relief grating structures, according to certain embodiments. Master mold 1000 may include a substrate 1010 and ridges 1020 on substrate 1010. Substrate 1010 and ridges 1020 may include same or different materials, such as silicon, silicon dioxide, quartz, GaAs, silicon nitride, or metals (e.g., nickel). Ridges 1020 may form a pattern that complements the nano-structure to be molded (e.g., for direct molding using master mold) or a pattern that replicates the nano-structure to be molded (e.g., for molding using a soft stamp that complements both the master mold and the nano-structure to be molded).

The pattern formed by ridges 1020 may include various dimensions and other parameters. For example, the pattern may be a periodic pattern having a period 1030. Each ridge 1020 may have a width 1032 and a height 1034 (or depth). The ratio between width 1032 and period 1030 may be referred to as the duty cycle, and the ratio between height 1034 and width 032 may be referred to as the aspect ratio. The surface of master mold 1000 may have a surface energy $\Psi$, which may affect the adhesion properties of master mold 1000. In some embodiments, ridges 1020 may have any desirable shape, such as a triangle, rectangle, square, trapezoid, parallelogram with any slant angle, other polygon, etc. Any of the parameters of master mold 1000 may need to be modified for various reasons. For example, the preliminary master mold may be made with some defects, the desired pattern or parameters of the imprinted device may be changed, or a master mold may be worn out after a number of NIL processes.

Figure 11A:
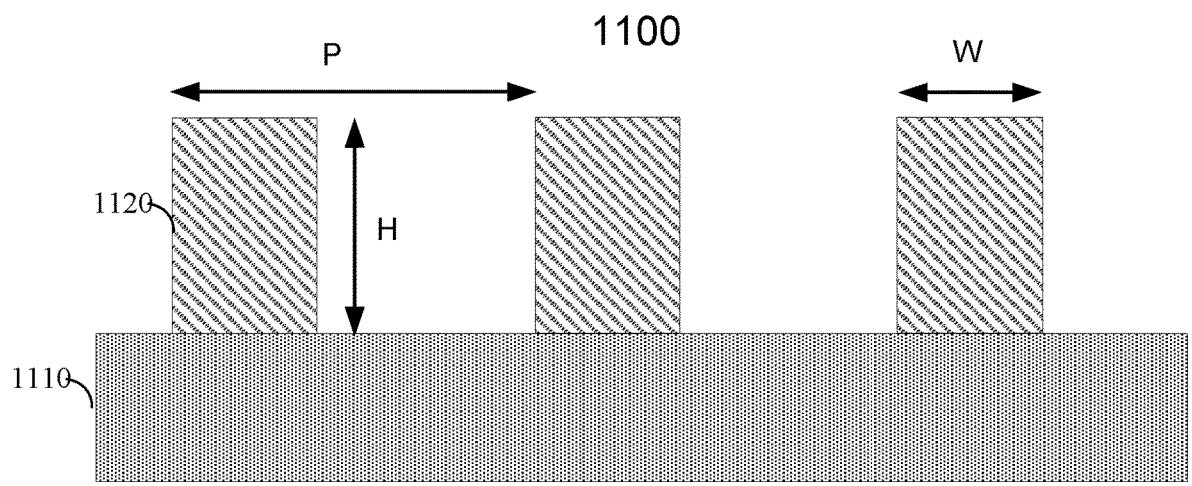
FIGS. 11A-11C illustrate an example process for modifying the duty cycle of a master mold for fabricating nano-structures according to certain embodiments.
Figure 11B:
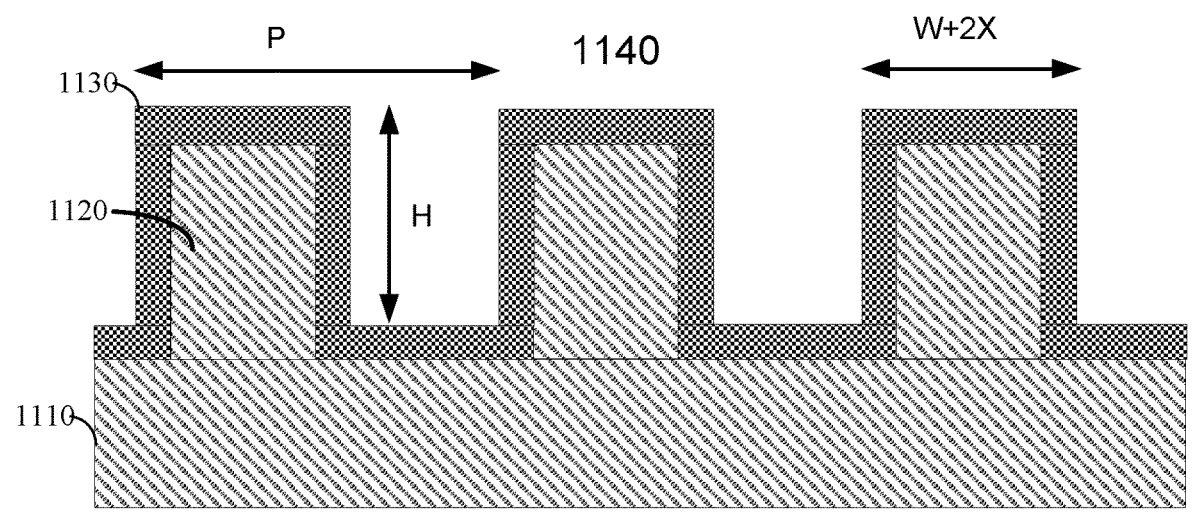
Figure 11C:
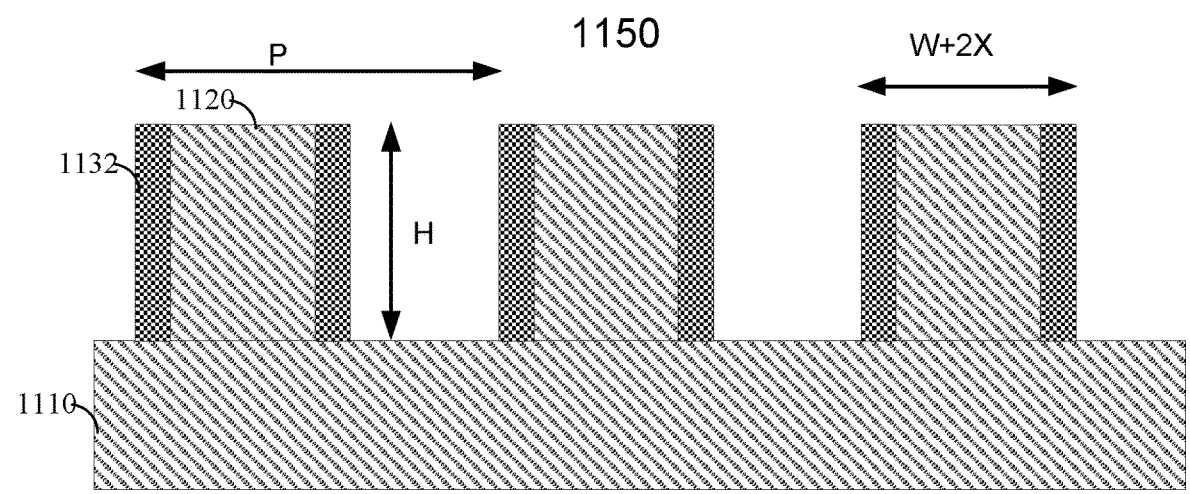

FIGS. 11A-11C illustrate an example process for modifying the duty cycle of a master mold for fabricating a nano-structure according to certain embodiments. FIG. 11A illustrates an example master mold 1100, which may be a preliminary master mold or a master mold that has been used and worn out as described above with respect to FIG. 10. Master mold 1100 may include a substrate 1110 and a plurality of ridges 1120 on substrate 1110. Ridges 1120 may form a periodic pattern having a period P. Each ridge 1120 may have a width W and a height H. The ratio between width W and period P may be referred to as the duty cycle. To modify the duty cycle of the structures on master mold 1100, width W of ridges 1120 may be changed by anisotropic etching (e.g., to reduce width W) or spacer deposition in combination with anisotropic etching (e.g., to increase width W).

FIG. 11B illustrates an example process of spacer deposition on master mold 1100 according to certain embodiments. A spacer layer 1130 may be deposited on master mold 1100 using, for example, an atomic layer deposition (ALD) technique. Spacer layer 1130 may have a thickness of a few nanometers, tens of nanometers, or thicker. In some embodiments, spacer layer 1130 may be formed on the side walls of ridges 1120, the top of ridges 1120, and the exposed areas of substrate 1110. In some embodiments, spacer layer 1130 may be formed on one side wall of each ridge 1120, the top of ridges 1120, and the exposed areas of substrate 1110. In some embodiments, spacer layer 1130 may have a substantially uniform thickness X. A structure 1140 formed after the spacer deposition may have the same period P and the same ridge height H (or depth) as the structure on master mold 1100 shown in FIG. 11A. The width of the ridges of structure 1140 may be W+2X, and thus the duty cycle of structure 1140 may be (W+2X)/P. Spacer layer 1130 on top of ridges 1120 and the exposed areas of substrate 1110 may be removed subsequently to form a modified master mold with the desired duty cycle.

FIG. 11C illustrates an example modified master mold 1150 according to certain embodiments. Modified master mold 1150 may be formed by anisotropic etching of spacer layer 1130 in structure 1140. The anisotropic etching may have a much higher vertical etch rate than the horizontal etch rate. In some embodiments, plasma etching, ion beam etching, reactive ion beam etching, chemical assisted reactive ion beam etching, or any combination may be used for the anisotropic etching. As a result, spacer layer 1130 on top of ridges 1120 and the exposed areas of substrate 1110 may be removed, while the portion 1132 of spacer layer 1130 on the side walls of ridges 1120 may not be removed. Thus, modified master mold 1150 may include a periodic structure that have a period P and a height H as in master mold 1100, but may have a width W+2X rather than W, or a duty cycle (W+2X)/P rather than W/P. In this way, the ridge width and duty cycle of the structure on the master mold may be fine-tuned. In some embodiments, one or more deposition and etching processes as described above may be performed to achieve a desired ridge width or duty cycle.

Figure 12A:
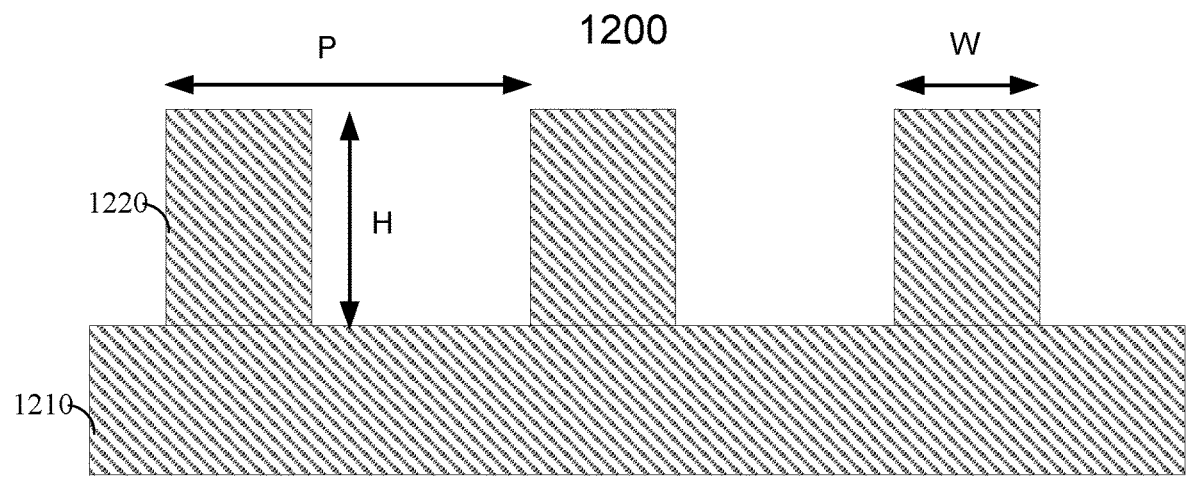
FIGS. 12A-12C illustrate an example process for modifying the height (or depth) of a master mold for fabricating nano-structures according to certain embodiments.
Figure 12B:
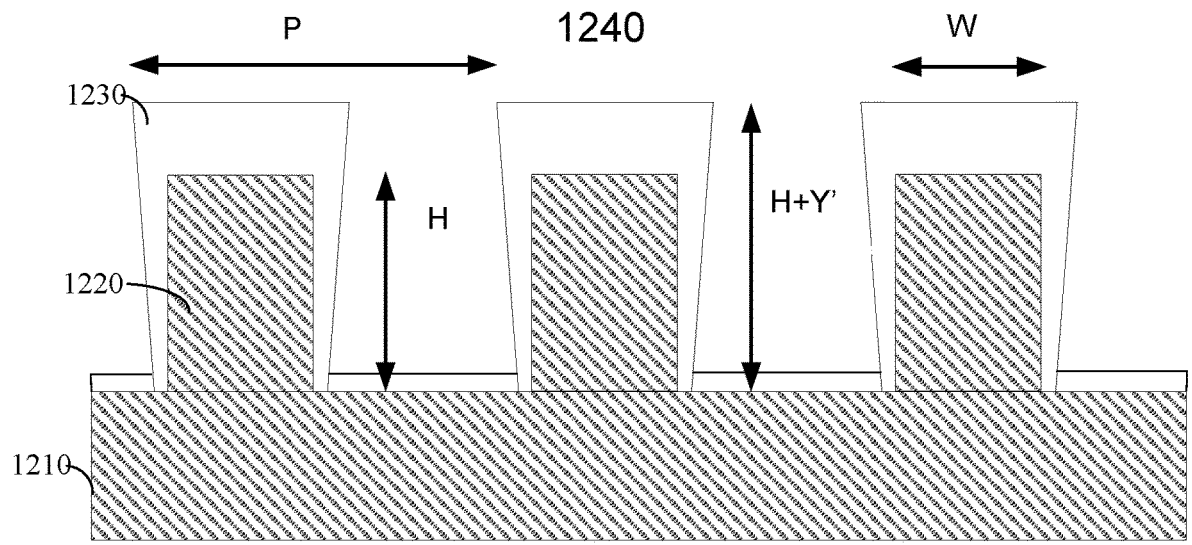
Figure 12C:
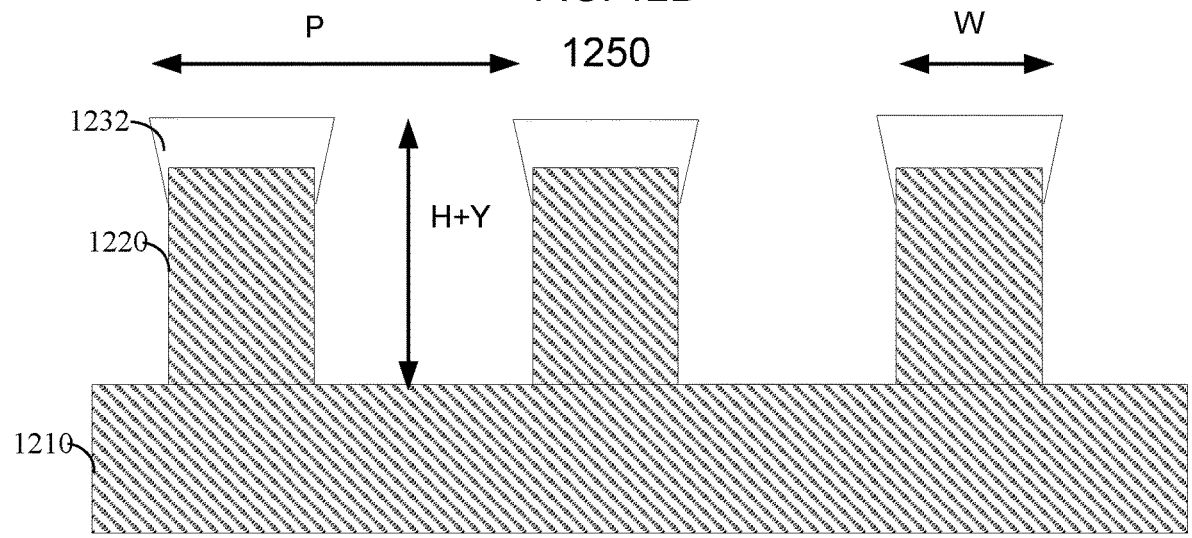

FIGS. 12A-12C illustrate an example process for modifying the height (or depth) of a master mold for fabricating nano-structures according to certain embodiments. FIG. 12A illustrates an example master mold 1200, which may be a preliminary master mold or a master mold that has been used and worn out as described above with respect to FIG. 10. Master mold 1200 may include a substrate 1210 and ridges 1220 on substrate 1210. Ridges 1220 may form a periodic pattern having a period P. Each ridge 1220 may have a width W and a height H. To modify height H of ridges 1220 of the structure on master mold 1200, a material layer may be formed on master mold 1200, and may then be etched to keep a layer with a desired thickness on top of ridges 1220, while removing the material layer in other areas including the side walls of ridges 1220.

FIG. 12B illustrates an example process of material layer deposition on master mold 1200 according to certain embodiments. A material layer 1230 may be deposited on master mold 1200 using, for example, physical vapor deposition (PVD), chemical vapor deposition (CVD), or plasma-enhanced chemical vapor deposition processes (PECVD) technique. Material layer 1230 may have a variable thickness at different areas of master mold 1200. For example, material layer 1230 may have a thickness Y' on top of ridges 1220, and may be thinner in other areas of master mold 1200. Y' may be a few nanometers, tens of nanometers, or more. A structure 1240 formed after the material layer deposition may have the same period P and about the same (or slightly larger) ridge width W as in the structure on master mold 1200 shown in FIG. 12A. The height of the ridges of structure 1240 with respect to the top surface of substrate 1210 may be H+Y'. Material layer 1230 may subsequently be etched isotropically to leave a portion with a thickness Y on top of ridges 1220, while substantially removing material layer 1230 in other areas of structure 1240 to form a modified master mold with the desired ridge height.

FIG. 12C illustrates an example modified master mold 1250 according to certain embodiments. Modified master mold 1250 may be formed by isotropic etching of deposited material layer 1230 of structure 1240. The isotropic etching may have substantially similar etch rates in horizontal and vertical directions. The isotropic etching may be controlled such that material layer 1230 in other areas of structure 1240 other than the top of ridges 1220 may be removed, while leaving a layer with a thickness of Y on top of ridges 1220. Thus, modified master mold 1250 may include a periodic structure that has a period P and a ridge width W approximately same as master mold 1200, but have a height H+Y rather than H. In this way, the ridge height of the structure on the master mold may be fine-tuned. In some embodiments, one or more deposition and etching processes as described above may be performed to achieve a desired ridge height.

Figure 13A:
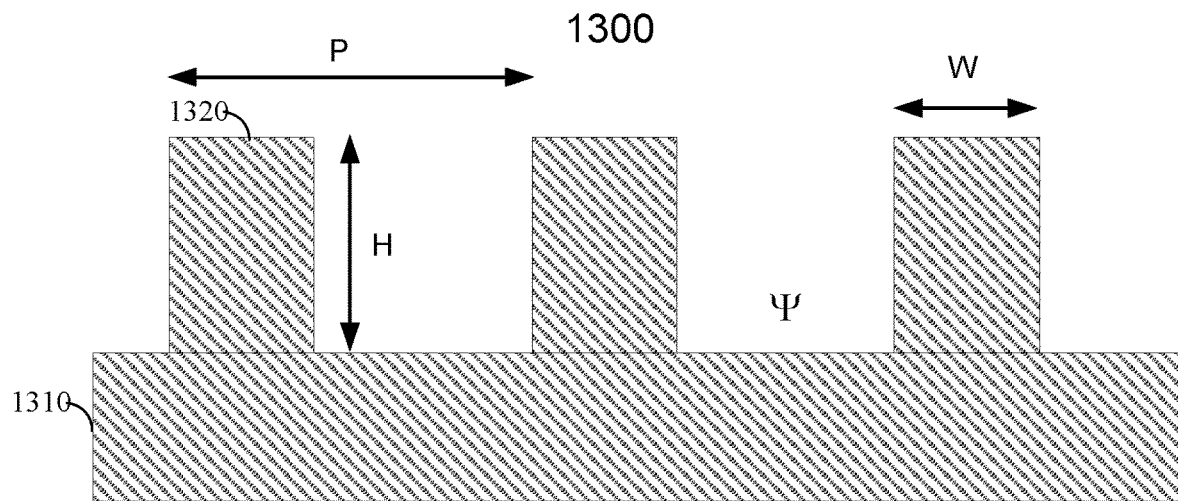
FIGS. 13A-13C illustrate an example process for modifying the surface energy of a master mold for fabricating nano-structures according to certain embodiments.
Figure 13B:
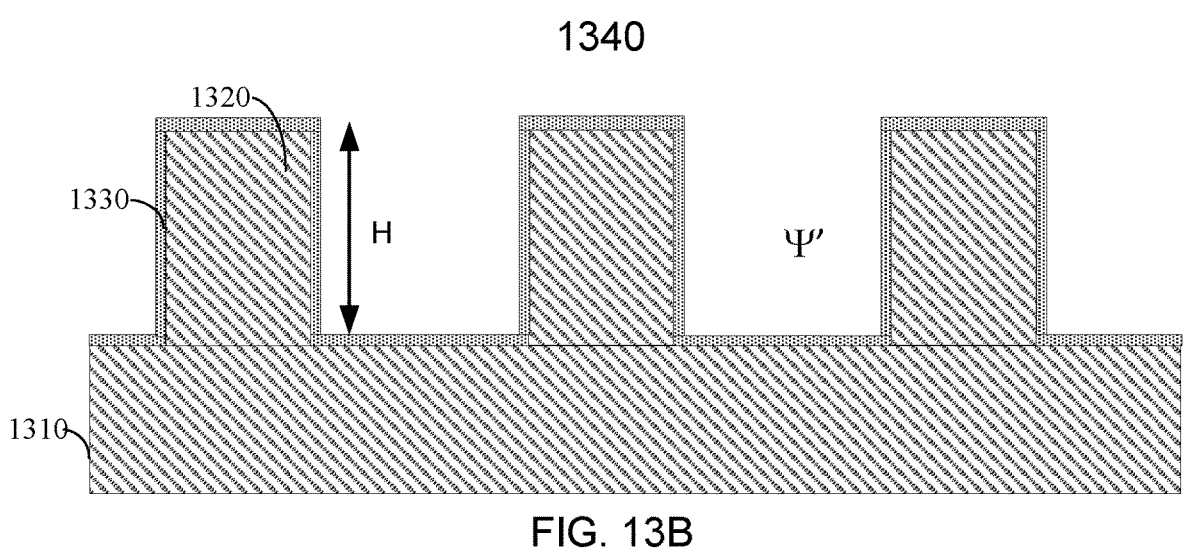
Figure 13C:
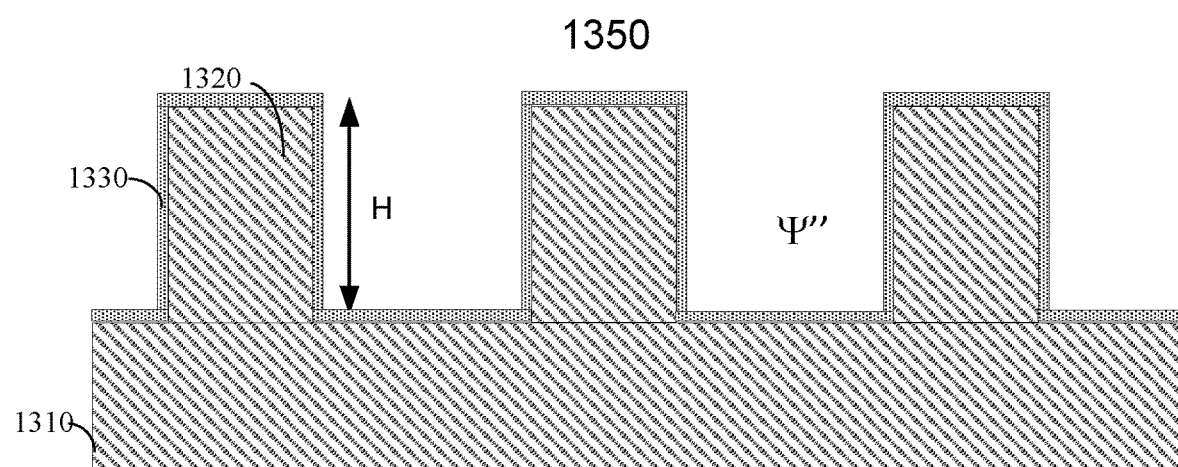

FIGS. 13A-13C illustrate an example process for modifying the surface energy of a master mold for fabricating nano-structures according to certain embodiments. FIG. 13A illustrates an example master mold 1300, which may be a preliminary master mold or a master mold that has been used and worn out as described above with respect to FIG. 10. Master mold 1300 may include a substrate 1310 and ridges 1320 on substrate 1310. Ridges 1320 may form a periodic pattern having a period P. Each ridge 1320 may have a width W and a height H. The surface of master mold 1300 may have a surface energy $\Psi$, which may affect the adhesion properties of master mold 1300. For example, a larger surface energy may correspond to a higher adhesion between master mold 1300 and the imprint material layer at the interfaces between master mold and the imprint material layer. To modify surface energy $\Psi$ of master mold 1300, a thin spacer layer including a material with a desired surface energy may be formed on master mold 1300 and may optionally be surface-treated to achieve the desired reduced surface energy.

FIG. 13B illustrates an example modified master mold 1340 according to certain embodiments. A thin spacer layer 1330 may be deposited on master mold 1300 using, for example, an atomic layer deposition (ALD) technique. Spacer layer 1330 may include a material that is different from the materials of ridges 1320 and substrate 1310. For example, the material of spacer layer 1330 may have a lower surface energy than the materials of ridges 1320 and substrate 1310. In some embodiments, spacer layer 1330 may be formed on the side walls of ridges 1320, the top of ridges 1320, and the exposed areas of substrate 1310. In some embodiments, spacer layer 1330 may have a substantially uniform thickness of, for example, a few nanometers. Modified master mold 1340 formed after the spacer deposition may have the same period P and same ridge height H (or depth) as the structure on master mold 1300 shown in FIG. 13A. The width of the ridges of modified master mold 1340 may be slightly changed. The surface energy $\Psi'$ of modified master mold 1340 may be different from (e.g., lower than) surface energy $\Psi$ of master mold 1300.

FIG. 13C illustrates an example modified master mold 1350 according to certain embodiments. Modified master mold 1350 may be made by surface-treating modified master mold 1340 or master mold 1300. Various surface treatment techniques using, for example, hexamethyldisilazane (HMDS) or fluorinated self-assembled monolayer (FSAM), may be used to change the surface energy of the master mold. Modified master mold 1350 may have the same period P, and the same ridge height H (or depth) and width as modified master mold 1340 shown in FIG. 13B or master mold 1300 shown in FIG. 13A. The surface energy Ψ''' of modified master mold 1350 may be different from surface energy Ψ of master mold 1300 or surface energy Ψ'' of modified master mold 1300.

Figure 14A:
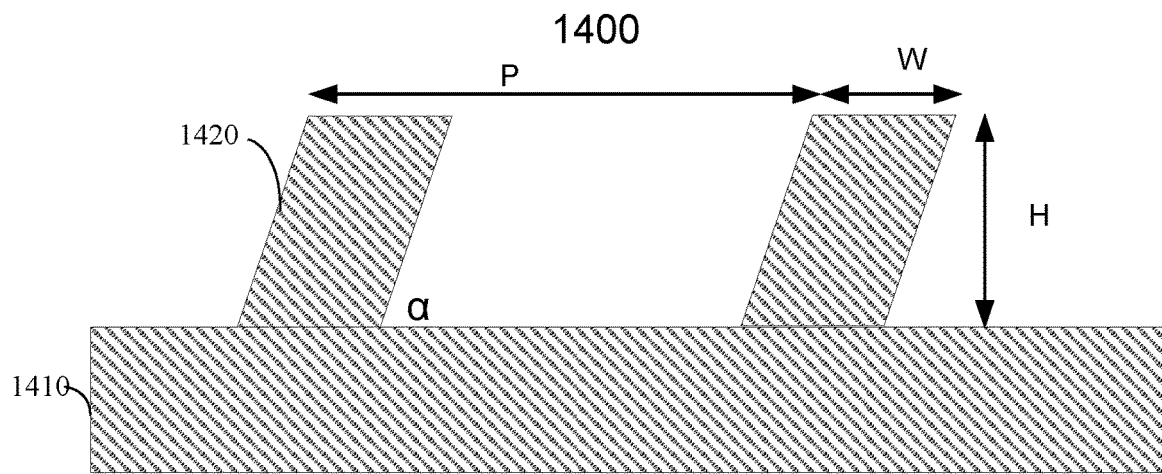
FIGS. 14A-14C illustrate an example process for modifying the profile of a master mold for fabricating nano-structures according to certain embodiments.
Figure 14B:
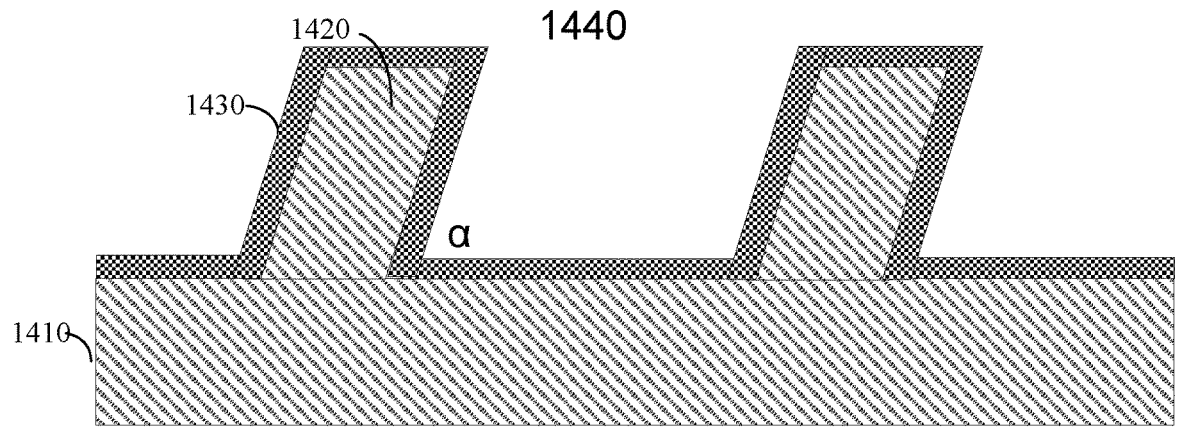
Figure 14C:
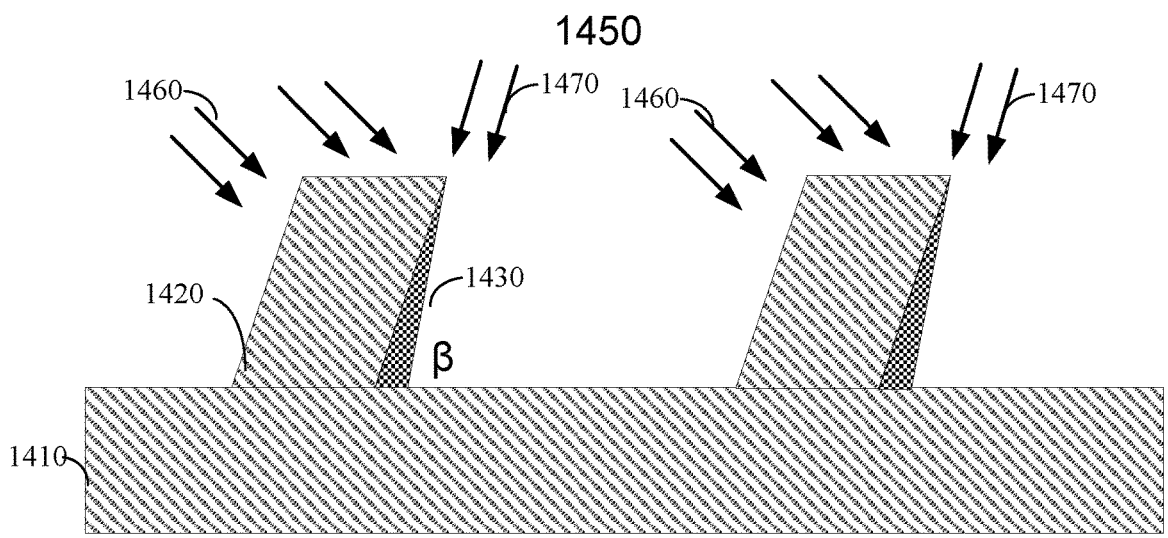

FIGS. 14A-14C illustrate an example process for modifying the profile of a master mold for fabricating nanostructures according to certain embodiments. FIG. 14A illustrates an example master mold 1400, which may be a preliminary master mold or a master mold that has been used and worn out. Master mold 1400 may include a substrate 1410 and ridges 1420 on substrate 1410. Ridges 1420 may form a periodic pattern having a period P. Each ridge 1420 may have a width W and a height H. Each ridge 1420 may be tilted with a slant angle α for both the leading edge and the trailing edge. In some embodiments, the leading edge and trailing edge of ridge 1420 may have different slant angles. To modify the profile (e.g., slant angle of leading or trailing angle) of ridges 1420 on master mold 1400, a spacer layer may be formed on master mold 1400, and may then be etched non-uniformly to selectively remove the spacer layer in certain areas.

FIG. 14B illustrates an example process of spacer layer deposition on master mold 1400 according to certain embodiments. A spacer layer 1430 may be deposited on master mold 1400 using, for example, an atomic layer deposition (ALD) technique. In some embodiments, spacer layer 1430 may be formed using several deposition processes. Spacer layer 1430 may have a thickness of a few nanometers, tens of nanometers, or thicker. In some embodiments, spacer layer 1430 may be formed on the side walls of ridges 1420, the top of ridges 1420, and the exposed areas of substrate 1410. In some embodiments, spacer layer 1430 may be formed on one side wall of each ridge 1420, the top of ridges 1420, and the exposed areas of substrate 1410. In some embodiments, spacer layer 1430 may have a substantially uniform thickness. Ridges in a structure 1440 formed after the spacer deposition may have the same slant angle α as the ridges in master mold 1400. In some embodiments, spacer layer 1430 may have different thicknesses at different regions. Thus, ridges in a structure 1440 formed after the spacer deposition may have a slant angle different from the slant angle of the ridges in master mold 1400. Spacer layer 1430 may be selectively removed to form a modified master mold with the desired ridge profile.

FIG. 14C illustrates an example modified master mold 1450 according to certain embodiments. Modified master mold 1450 may be formed by, for example, anisotropic etching or off-axis (slanted) etching of spacer layer 1430 on structure 1440. The anisotropic etching may have a vertical etch rate different from the horizontal etch rate. In some embodiments, spacer layer 1430 may be etched using slanted plasma etching, ion beam etching, reactive ion beam etching, or chemical assisted reactive ion beam etching. As shown in FIG. 14C, in some embodiments, spacer layer 1430 may be etched at multiple different angles to achieve the desired slant angle. For example, in the embodiment shown in FIG. 14C, spacer layer 1430 may be etched at an angle 1460 to remove spacer layer 1430 on the top and the leading edge of each ridge 1420, and may be etched at an angle 1470 to remove some of spacer layer 1430 on the trailing edge of each ridge 1420, where angle 1470 may be approximately equal to the desired slant angle β of the trailing edge of ridges 1420. As a result, the slant angle of the leading edge of ridges 1420 may remain unchanged, while the slant angle of the trailing edge of ridges 1420 may be changed to the desired slant angle β. Even though FIG. 14C shows changing the slant angle of the trailing edge of ridges 1420, the slant angle of the leading edge of ridges 1420 may be changed using the same techniques. In some embodiments, one or more deposition and etching processes as described above may be performed to achieve a desired profile of ridges 1420.

In various embodiments, the above-described techniques may be combined to modify one or more of the duty cycle (or ridge width), ridge height, surface energy, and ridge profile (or shape) of the master mold. For example, in some implementations, the duty cycle and the ridge height of the master mold may be independently or dependently controlled. In some implementations, techniques described herein may be combined to control the duty cycle, ridge height, surface energy, and ridge profile (or shape) of the master mold. Furthermore, the above-described techniques may also be used to modify one or more of the duty cycle (or ridge width), ridge height, surface energy, and ridge profile (or shape) of a soft stamp or an imprinted device.

Figure 15:
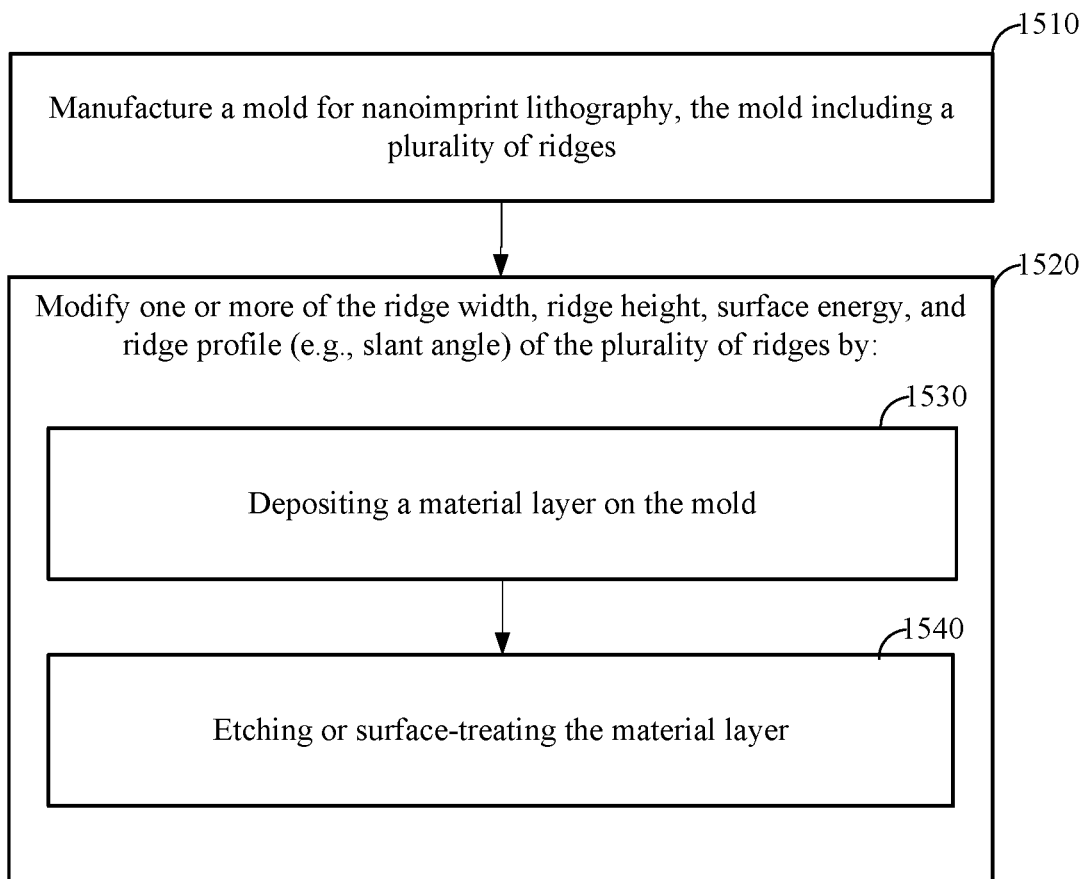
FIG. 15 is a simplified flow chart illustrating an example method of fabricating a nanoimprint lithography (NIL) mold according to certain embodiments.

FIG. 15 is a simplified flow chart 1500 illustrating an example method of fabricating a nanoimprint lithography (NIL) mold according to certain embodiments. The operations described in flow chart 1500 are for illustration purposes only and are not intended to be limiting. In various implementations, modifications may be made to flow chart 1500 to add additional operations or to omit some operations. The operations described in flow chart 1500 may be performed using, for example, one or more deposition, etching, and surface treatment systems, such as ALD systems, PVD systems, CVD system, PECVD systems, wet or dry etching systems (e.g., plasma etching, ion beam etching, reactive ion beam etching, or chemical assisted reactive ion beam etching system), and HDMS or FSAM surface treatment systems.

At block 1510, a preliminary mold for nanoimprint lithography may be manufactured. As described above, the preliminary mold may include rigid materials (hard mold), such as silicon, silicon dioxide, quartz, fused silica, GaAs, silicon nitride, or metals (e.g., nickel), or soft or flexible materials (soft mold), such as polymer-based material, including polydimethylsiloxane (PDMS), ethylene tetrafluoroethylene (ETFE), or polyethylene terephthalate (PET). In various embodiments, the preliminary mold may be manufactured using, for example, multiple stacked layers, or lithography (e.g., electron-beam (EB) lithography or laser interference lithography) and etching (e.g., reactive ion etching) processes.

The preliminary mold may include a plurality of ridges. The plurality of ridges may form a periodic nanostructure, such as a surface-relief grating. In some embodiments, the grating may be a slanted grating where each ridge may have a slanted leading edge and/or a slanted trailing edge. The periodic nanostructure may have a period P, and each ridge may have a width W and a height H. The surface of the preliminary mold may have a surface energy T. In many cases, the parameters of the preliminary mold, such as the width or height of the ridges, the surface energy, or the slant angle of the ridges on the preliminary mold, may be different from the desired or designed values. Therefore, if the preliminary mold is used for nanoimprint lithography, the errors on the preliminary mold may be transferred to the imprinted devices or may cause defects on the imprinted devices or damages to the preliminary mold itself.

At block 1520, one or more of the ridge width, ridge height, surface energy, and ridge profile (e.g., slant angle) of the ridges may be modified to make the final mold with the desired parameters. In some embodiments, the modification may include depositing a material layer on the preliminary mold and etching the deposited layer isotropically or anisotropically to remove a portion of the deposited layer. In some embodiments, the modification may include depositing a material layer on the preliminary mold and/or surface-treating the deposited material layer.

At block 1530, a material layer may be deposited on the preliminary mold. For example, as described above, to modify the width of the ridges on the preliminary mold or to change the slant angle of the ridges, a spacer layer of a certain thickness may be deposited on the preliminary mold using, for example, an ALD process. To modify the surface energy on the preliminary mold, a thin spacer layer having a surface energy different from the surface energy of the preliminary mold may be deposited on the preliminary mold using, for example, an ALD process. To modify the height of the ridges, a material layer having a variable thickness at different areas may be deposited on the preliminary mold using, for example, physical vapor deposition (PVD), chemical vapor deposition (CVD), or plasma-enhanced chemical vapor deposition processes (PECVD) technique.

At block 1540, the material layer may be etched or surface-treated. For example, as described above, to modify the width of the ridges on the preliminary mold, the deposited spacer layer may be etched anisotropically using, for example, plasma etching, ion beam etching, reactive ion beam etching, or chemical assisted reactive ion beam etching, to remove the spacer layer on top of the ridges and on the exposed areas of the substrate, while leaving the spacer layer on the side walls of the ridges. To change the slant angle of the ridges, the deposited spacer layer may be etched using anisotropic etching or off-axis etching, such as slanted plasma etching, ion beam etching, reactive ion beam etching, or chemical assisted reactive ion beam etching, at one or more etching angles. To modify the height of the ridges, the deposited material layer may be etched using wet or dry isotropic etching. To modify the surface energy on the preliminary mold, the deposited spacer layer may optionally be surface treated using HMDs or FSAM.

As described above, the method and operations described with respect to FIG. 15 may be combined to modify one or more of the duty cycle (or ridge width), ridge height, surface energy, and ridge profile (or shape) of a master mold. The method and operations described with respect to FIG. 15 may also be used to modify one or more of the duty cycle (or ridge width), ridge height, surface energy, and ridge profile (or shape) of a soft stamp or an imprinted device that includes a plurality of ridges on a substrate.

Embodiments of the invention may be used to fabricate components of an artificial reality system or may be implemented in conjunction with an artificial reality system. Artificial reality is a form of reality that has been adjusted in some manner before presentation to a user, which may include, for example, a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Figure 16:
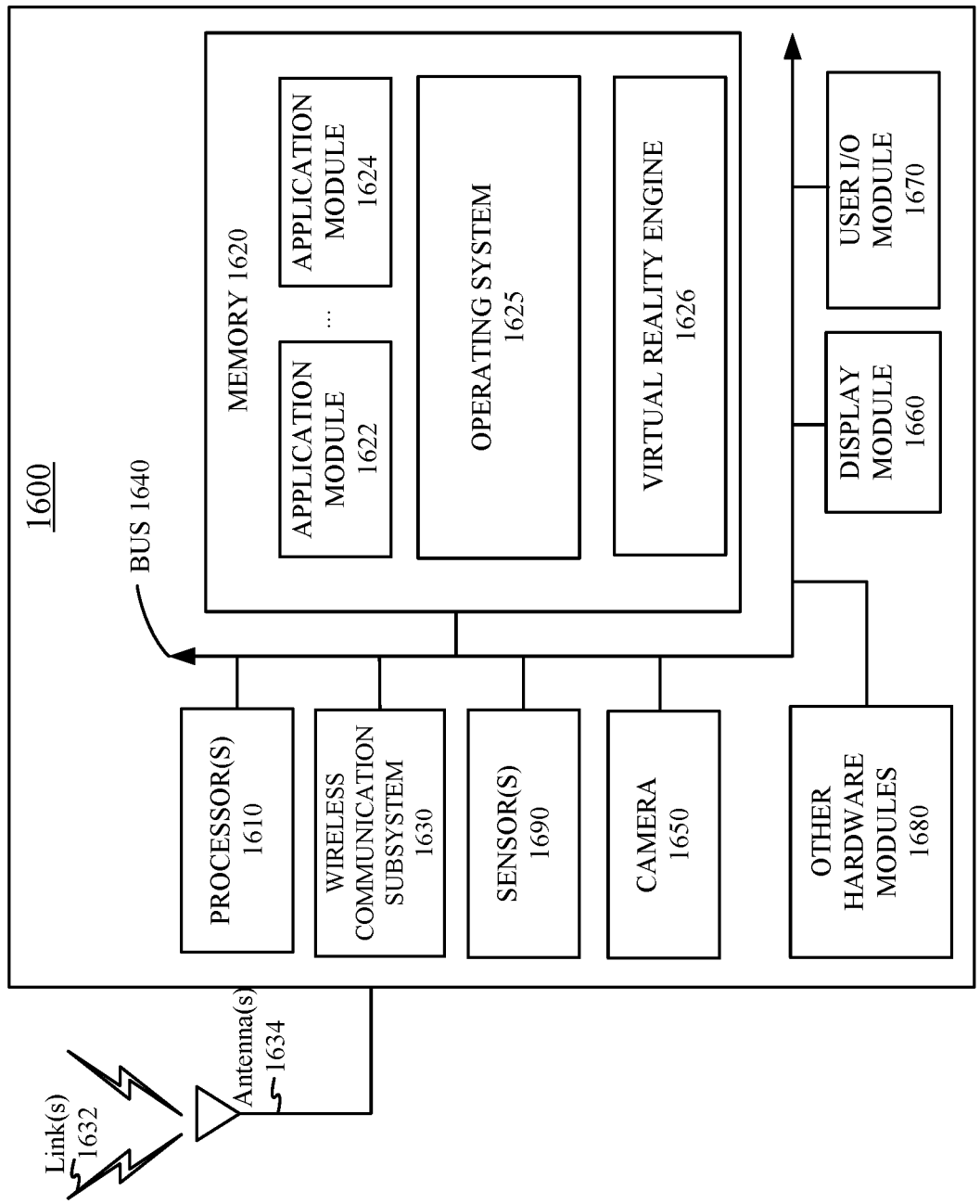
FIG. 16 is a simplified block diagram of an example electronic system of an example near-eye display according to certain embodiments.

FIG. 16 is a simplified block diagram of an example electronic system 1600 of an example near-eye display (e.g., HMD device) for implementing some of the examples disclosed herein. Electronic system 1600 may be used as the electronic system of an HMD device or other near-eye displays described above. In this example, electronic system 1600 may include one or more processor(s) 1610 and a memory 1620. Processor(s) 1610 may be configured to execute instructions for performing operations at a number of components, and can be, for example, a general-purpose processor or microprocessor suitable for implementation within a portable electronic device. Processor(s) 1610 may be communicatively coupled with a plurality of components within electronic system 1600. To realize this communicative coupling, processor(s) 1610 may communicate with the other illustrated components across a bus 1640. Bus 1640 may be any subsystem adapted to transfer data within electronic system 1600. Bus 1640 may include a plurality of computer buses and additional circuitry to transfer data.

Memory 1620 may be coupled to processor(s) 1610. In some embodiments, memory 1620 may offer both short-term and long-term storage and may be divided into several units. Memory 1620 may be volatile, such as static random access memory (SRAM) and/or dynamic random access memory (DRAM) and/or non-volatile, such as read-only memory (ROM), flash memory, and the like. Furthermore, memory 1620 may include removable storage devices, such as secure digital (SD) cards. Memory 1620 may provide storage of computer-readable instructions, data structures, program modules, and other data for electronic system 1600. In some embodiments, memory 1620 may be distributed into different hardware modules. A set of instructions and/or code might be stored on memory 1620. The instructions might take the form of executable code that may be executable by electronic system 1600, and/or might take the form of source and/or installable code, which, upon compilation and/or installation on electronic system 1600 (e.g., using any of a variety of generally available compilers, installation programs, compression/decompression utilities, etc.), may take the form of executable code.

In some embodiments, memory 1620 may store a plurality of application modules 1622 through 1624, which may include any number of applications. Examples of applications may include gaming applications, conferencing applications, video playback applications, or other suitable applications. The applications may include a depth sensing function or eye tracking function. Application modules 1622-1724 may include particular instructions to be executed by processor(s) 1610. In some embodiments, certain applications or parts of application modules 1622-1724 may be executable by other hardware modules 1680. In certain embodiments, memory 1620 may additionally include secure memory, which may include additional security controls to prevent copying or other unauthorized access to secure information.

In some embodiments, memory 1620 may include an operating system 1625 loaded therein. Operating system 1625 may be operable to initiate the execution of the instructions provided by application modules 1622-1724 and/or manage other hardware modules 1680 as well as interfaces with a wireless communication subsystem 1630 which may include one or more wireless transceivers. Operating system 1625 may be adapted to perform other operations across the components of electronic system 1600 including threading, resource management, data storage control and other similar functionality.

Wireless communication subsystem 1630 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 1600 may include one or more antennas 1634 for wireless communication as part of wireless communication subsystem 1630 or as a separate component coupled to any portion of the system. Depending on desired functionality, wireless communication subsystem 1630 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 1630 may permit data to be exchanged with a network, other computer systems, and/or any other devices described herein. Wireless communication subsystem 1630 may include a means for transmitting or receiving data, such as identifiers of HMD devices, position data, a geographic map, a heat map, photos, or videos, using antenna(s) 1634 and wireless link(s) 1632. Wireless communication subsystem 1630, processor(s) 1610, and memory 1620 may together comprise at least a part of one or more of a means for performing some functions disclosed herein.

Embodiments of electronic system 1600 may also include one or more sensors 1690. Sensor(s) 1690 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 1690 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or some combination thereof. The position sensors may be located external to the IMU, internal to the IMU, or some combination thereof. At least some sensors may use a structured light pattern for sensing.

Electronic system 1600 may include a display module 1660. Display module 1660 may be a near-eye display, and may graphically present information, such as images, videos, and various instructions, from electronic system 1600 to a user. Such information may be derived from one or more application modules 1622-1724, virtual reality engine 1626, one or more other hardware modules 1680, a combination thereof, or any other suitable means for resolving graphical content for the user (e.g., by operating system 1625). Display module 1660 may use liquid crystal display (LCD) technology, light-emitting diode (LED) technology (including, for example, OLED, ILED, mLED, AMOLED, TOLED, etc.), light emitting polymer display (LPD) technology, or some other display technology.

Electronic system 1600 may include a user input/output module 1670. User input/output module 1670 may allow a user to send action requests to electronic system 1600. An action request may be a request to perform a particular action. For example, an action request may be to start or end an application or to perform a particular action within the application. User input/output module 1670 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 1600. In some embodiments, user input/output module 1670 may provide haptic feedback to the user in accordance with instructions received from electronic system 1600. For example, the haptic feedback may be provided when an action request is received or has been performed.

Electronic system 1600 may include a camera 1650 that may be used to take photos or videos of a user, for example, for tracking the user's eye position. Camera 1650 may also be used to take photos or videos of the environment, for example, for VR, AR, or MR applications. Camera 1650 may include, for example, a complementary metal-oxide-semiconductor (CMOS) image sensor with a few millions or tens of millions of pixels. In some implementations, camera 1650 may include two or more cameras that may be used to capture 3-D images.

In some embodiments, electronic system 1600 may include a plurality of other hardware modules 1680. Each of other hardware modules 1680 may be a physical module within electronic system 1600. While each of other hardware modules 1680 may be permanently configured as a structure, some of other hardware modules 1680 may be temporarily configured to perform specific functions or temporarily activated. Examples of other hardware modules 1680 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 1680 may be implemented in software.

In some embodiments, memory 1620 of electronic system 1600 may also store a virtual reality engine 1626. Virtual reality engine 1626 may execute applications within electronic system 1600 and receive position information, acceleration information, velocity information, predicted future positions, or some combination thereof of the HMD device from the various sensors. In some embodiments, the information received by virtual reality engine 1626 may be used for producing a signal (e.g., display instructions) to display module 1660. For example, if the received information indicates that the user has looked to the left, virtual reality engine 1626 may generate content for the HMD device that mirrors the user's movement in a virtual environment. Additionally, virtual reality engine 1626 may perform an action within an application in response to an action request received from user input/output module 1670 and provide feedback to the user. The provided feedback may be visual, audible, or haptic feedback. In some implementations, processor(s) 1610 may include one or more GPUs that may execute virtual reality engine 1626.

In various implementations, the above-described hardware and modules may be implemented on a single device or on multiple devices that can communicate with one another using wired or wireless connections. For example, in some implementations, some components or modules, such as GPUs, virtual reality engine 1626, and applications (e.g., tracking application), may be implemented on a console separate from the head-mounted display device. In some implementations, one console may be connected to or support more than one HMD.

In alternative configurations, different and/or additional components may be included in electronic system 1600. Similarly, functionality of one or more of the components can be distributed among the components in a manner different from the manner described above. For example, in some embodiments, electronic system 1600 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A method of fabricating a nanoimprint lithography (NIL) mold with a target surface-relief structure, the method comprising:
    manufacturing a preliminary surface-relief structure of the NIL mold, the preliminary surface-relief structure comprising a plurality of ridges, wherein a parameter of the preliminary surface-relief structure is different from a corresponding parameter of the target surface-relief structure; and
    modifying the parameter of the preliminary surface-relief structure to make the target surface-relief structure, wherein modifying the parameter of the preliminary surface-relief structure comprises:
        depositing a material layer on the preliminary surface-relief structure using a vapor deposition process; and
        etching or surface-treating the deposited material layer using a dry or wet isotropic etching process to make the target surface-relief structure, wherein the target surface-relief structure is different from the preliminary surface-relief structure in at least one of a height or a slant angle of a ridge in the plurality of ridges.

2. The method of claim 1, wherein the NIL mold comprises a master NIL mold or a soft stamp for nanoimprint lithography.

3. The method of claim 1, wherein the parameter of the preliminary surface-relief structure comprises a width of each of the plurality of ridges.

4. The method of claim 3, wherein modifying the parameter of the preliminary surface-relief structure comprises:
    depositing a spacer layer on the preliminary surface-relief structure; and
    anisotropically etching the spacer layer to remove the spacer layer on top of the plurality of ridges and the spacer layer between the plurality of ridges, and to keep the spacer layer on sidewalls of the plurality of ridges.

5. The method of claim 4, wherein the etching comprises plasma etching, ion beam etching, reactive ion beam etching, or chemical assisted reactive ion beam etching.

6. The method of claim 1, wherein the parameter of the preliminary surface-relief structure comprises a surface energy of the preliminary surface-relief structure.

7. The method of claim 6, wherein modifying the parameter of the preliminary surface-relief structure comprises:
    depositing a spacer layer on the preliminary surface-relief structure, wherein the spacer layer has a surface energy different from the surface energy of the preliminary surface-relief structure; and
    surface-treating the spacer layer.

8. The method of claim 7, wherein surface-treating the spacer layer comprises:
    treating a surface of the spacer layer using hexamethyldisilazane (HMDS) or fluorinated self-assembled monolayer (F SAM).

9. The method of claim 1, wherein:
    the plurality of ridges comprises slanted ridges; and
    the parameter of the preliminary surface-relief structure comprises a slant angle of an edge of the slanted ridges.

10. The method of claim 9, wherein modifying the parameter of the preliminary surface-relief structure comprises:
    depositing a spacer layer on the preliminary surface-relief structure; and
    etching the spacer layer at a slanted angle using a plasma or ion beam.

11. The method of claim 1, wherein the preliminary surface-relief structure comprises a slanted surface-relief grating structure.

12. A method of fabricating a target nanoimprint lithography (NIL) mold, the method comprising:
    manufacturing a preliminary NIL mold, the preliminary NIL mold comprising a substrate and a plurality of ridges on the substrate;
    depositing a material layer on the preliminary NIL mold; and
    etching the deposited material layer on the preliminary NIL mold at a slanted angle using a plasma or ion beam to achieve the target NIL mold, wherein the target NIL mold is different from the preliminary NIL mold in a slant angle of a ridge in the plurality of ridges.

13. The method of claim 12, wherein the depositing and the etching modify at least one of:
    a width of each of the plurality of ridges;
    a height of each of the plurality of ridges;
    a surface energy of the preliminary NIL mold; or
    a slant angle of an edge of each of the plurality of ridges.

14. The method of claim 12, wherein:
    the plurality of ridges form a slanted surface-relief grating.

* * * * *